(12) United States Patent
Nishiuchi et al.

(10) Patent No.: US 6,181,269 B1
(45) Date of Patent: Jan. 30, 2001

(54) METHOD FOR CONTROLLING AN ANALOG/DIGITAL CONVERTER

(75) Inventors: Taiki Nishiuchi; Yuji Kitaguchi, both of Tokyo (JP)

(73) Assignees: Mitsubishi Electric Engineering Company Limited; Mitsubishi Denki Kabushiki Kaisha, both of Tokyo (JP)

( * ) Notice: Under 35 U.S.C. 154(b), the term of this patent shall be extended for 0 days.

(21) Appl. No.: 09/228,645

(22) Filed: Jan. 12, 1999

(30) Foreign Application Priority Data

Aug. 3, 1998 (JP) .................................................. 10-219339

(51) Int. Cl.⁷ ...................................................... H03M 1/34
(52) U.S. Cl. ............................................. 341/164; 341/155
(58) Field of Search .................................. 341/155, 122, 341/120, 154, 164, 172, 110

(56) References Cited

U.S. PATENT DOCUMENTS 5,260,705 * 11/1993 Inukai ..................................... 341/155
5,877,719 * 3/1999 Matsui et al. ......................... 341/155
5,898,396 * 4/1999 Shimomura et al. ................ 341/163

* cited by examiner

Primary Examiner—Peguy JeanPierre
(74) Attorney, Agent, or Firm—Burns, Doane, Swecker & Mathis, LLP

(57) ABSTRACT

A clock signal is frequency divide to generate a plurality of signals CK, CK' having different periods, and a plurality of the control signals C, TZS are generated from them. One of the control signals C, TZS is selected as control signal TZ1, depending on the comparison section T1–T4, so as to change the period of the control signal for each comparison section. The reference voltage and the input voltage are compared according to the control signal TZ1. The period of the control signal is made shorter at the comparison sections other than the section T2 which requires a longer comparison time for the stabilization of the reference voltage, due to the large difference of the former reference voltage and the present reference voltage.

6 Claims, 33 Drawing Sheets

| TIMER | FUNCTION | SET VALUE |
|---|---|---|
| TIMER A | REPEATEDLY DOWN COUNTING TIMER FROM THE SET VALUE TO OUTPUT AN "UNDER FLOW SIGNAL" | 2 |
| TIMER B | ONE TIME DOWN COUNTING TIMER FROM THE SET VALUE TO OUTPUT AN "UNDER FLOW SIGNAL" ONLY ONE TIME | 4 |
| TIMER C | SAME TO THE TIMER A | 6 |

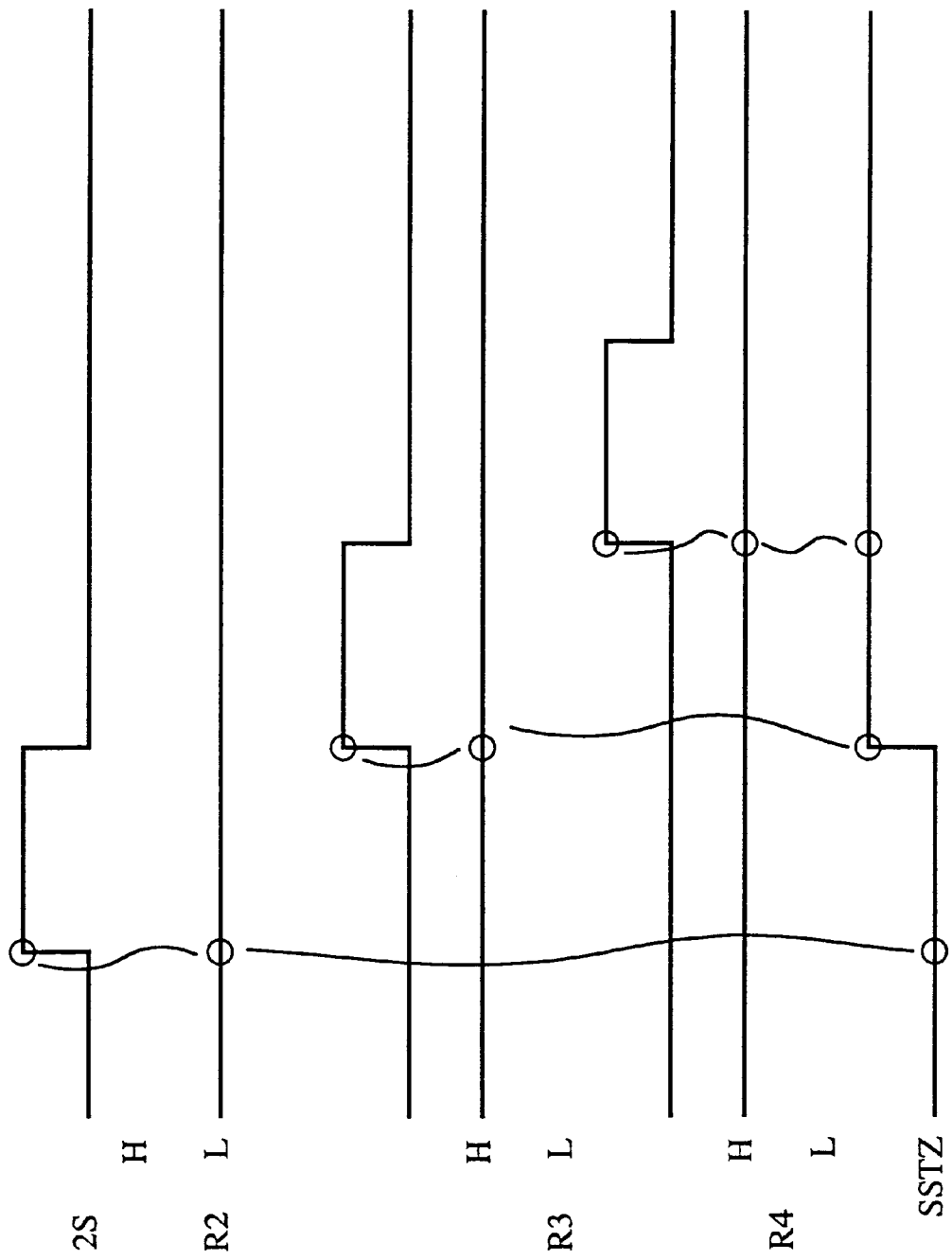

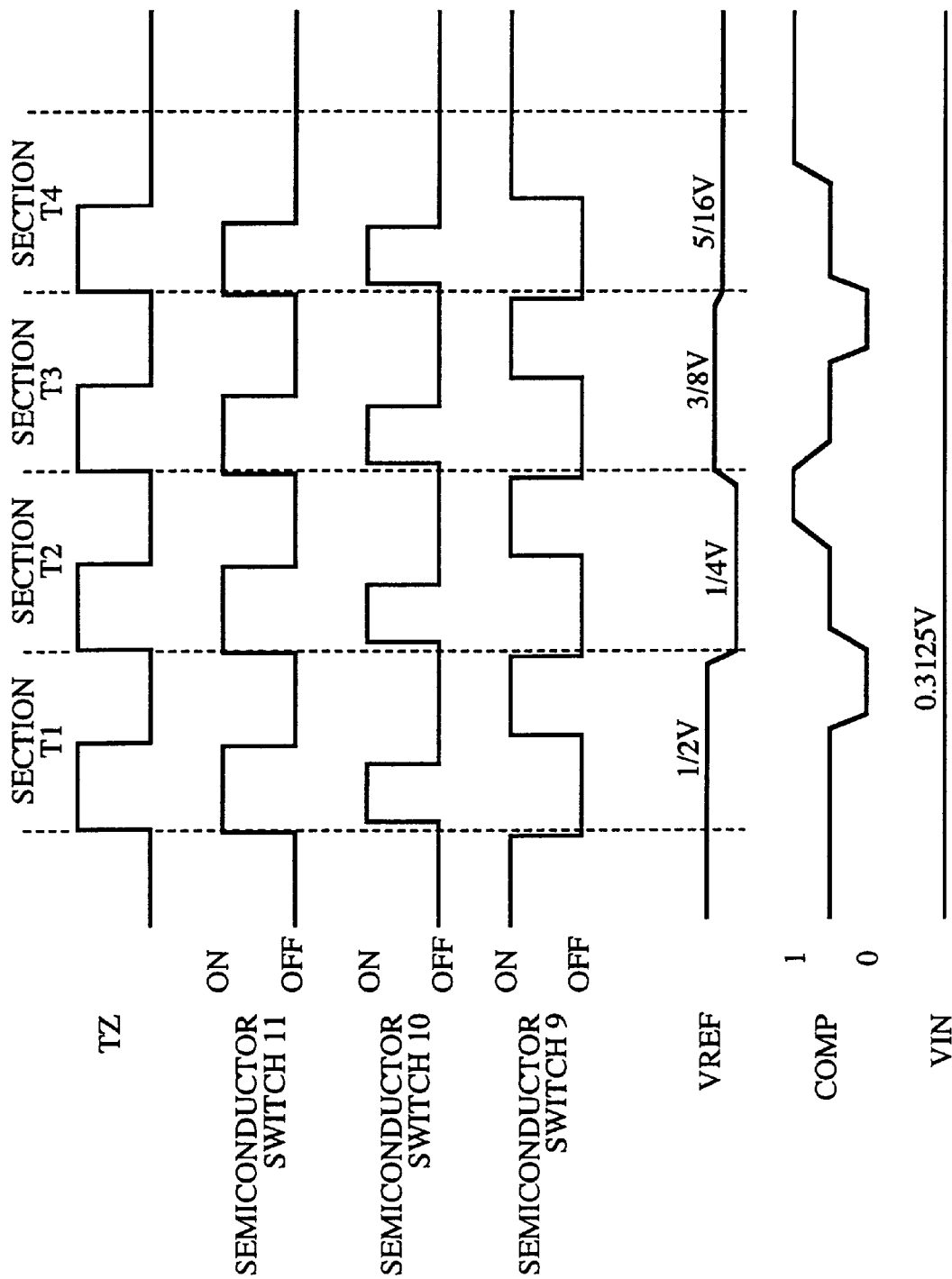

METHOD FOR CONTROLLING AN ANALOG/DIGITAL CONVERTER

BACKGROUND OF THE INVENTION

1. Field of the Invention

The present invention relates to a method for controlling an analog/digital converter (hereinafter called A/D converter), specifically, an A/D converter formed as a semiconductor integrated circuit on a semiconductor substrate.

2. Description of the Prior Art

FIG. 38 shows a block diagram of a successive approximation type A/D converter controlled by a conventional control method, which is disclosed, for example, in Japanese Patent Application JP A 1-321728.

The reference numeral 1 denotes a capacitor, 2 is an inverter. The capacitor 1 and the inverter 2 form a chopper type comparator. 3 is a successive approximation register for storing outputs of the comparator, the output of the comparator is called COMP hereinafter. Reference numeral 4 denotes ladder resistors connected in series. 5, 6 on both end of the ladder resistors are input terminals for imposing a standard voltage, which corresponds to the maximum input voltage that the A/D converter can convert. A switch group 7 selects a reference voltage VREF from the divided voltages by the ladder resistors 4, corresponding to the output data of the successive approximation register 3. The ladder resistors 4 and the switch group 7 form a digital/analog converter for converting the digital output of the successive approximation register 3 to an analog voltage signal. Reference numeral 8 denotes an input terminal for inputting an input voltage VIN.

Reference numerals 9, 10, 11 denote semiconductor switches, respectively. The reference voltage VREF output by the switch group 7 is imposed to the capacitor 1 through a semiconductor switch 9. The input voltage VIN inputted from the input terminal 8 is imposed to the capacitor 1 through a semiconductor switch 10. The input side and the output side of the inverter 2 are electrically connected or cut off by a semiconductor switch 11.

Reference numeral 12 is an A/D clock generating block, which generates timing clock signals (hereinafter called signals TZ) for controlling the timing of the turning-on and turning-off of the semiconductor switches 9–11, and the timing of the signal delivery from the successive approximation register 3 to the switch group 7. The A/D clock generating block is not explicitly referred in JP A 1-321728.

The control of the A/D converter is explained below.

FIG. 39 shows a timing chart of the signals in the A/D converter shown in FIG. 38, which is controlled by a conventional method for controlling an A/D converter. In this case, the input voltage VIN inputted from the input terminal 8 is 0.3125 times of the standard voltage, and is converted to a four bit digital signal. In the following explanation, the standard voltage is assumed to be one volt.

At first, a timing signal from the A/D clock generating block 12 makes the semiconductor switch 9 turn off. At the moment when the signal TZ sent from the A/D clock generating block 12 to the successive approximation register 3 changes to HIGH level (hereinafter simply referred "H" or "1"), the digital data stored in the successive approximation register 3 is sent to the switch group 7. The register 3 is designed so that the first output is always a hexadecimal "8h" signal. The output signal controls the switch group 7 to select a switch to output a half of the standard voltage V, because "8h" in the hexadecimal is a half of "16h". As a result, the switch group 7 outputs a reference voltage VREF of 0.5 volts.

Next, the A/D clock generating block 12 sends a signal to turn on the semiconductor switch 11, so that voltages of the input side and output side of the inverter 2 become equal. The value of the equal voltage is determined by the input and output characteristics of the inverter 2. Next, the semiconductor switch 10 is turned on so that the input voltage VIN charges the capacitor 1. After charging the capacitor, the semiconductor switches 10 and 11 are turned off successively. When the signal TZ becomes LOW level (hereinafter simply referred to as "L" or "0"), the semiconductor switch 9 is turned on. While the semiconductor switch 9 is on, the reference voltage VREF is imposed to the capacitor 1 through the switch group 7, and the reference voltage VREF and the input voltage VIN are compared to each other.

When the input voltage VIN is larger than the reference voltage VREF, the inverter 2 outputs "0", and when the input voltage VIN is smaller than the reference voltage VREF, the inverter 2 outputs "1". In this case the input voltage VIN is 0.3125V, and the reference voltage VREF is ½ V, thus the output signal COMP of the inverter 2 is "0", which is sent to the successive approximation register 3 and is stored in its register. Namely the value of the most upper bit is identified to be "0".

Then, the timing signal from the A/D clock generating block 12 controls the semiconductor switch 9 to turn off again. When the signal TZ becomes "H", the digital data stored in the successive approximation register 3 is sent to the switch group 7. As a result, since VIN<0.5 Volts, the switch group 7 selects ¼ volts, which is one fourth of the standard voltage, as a reference voltage VREF, from the outputs of the ladder resistors 7, corresponding to the digital signal. Next, the semiconductor switch 11 is controlled to turn on so that the input and output sides of the inverter 2 are electrically connected. Then the semiconductor switch 11 is made turn on to charge the capacitor 1.

After that, the semiconductor switch 9 is turned on and the reference voltage VREF is imposed from the switch group 7 to the capacitor 1. Then the reference voltage is compared with the input voltage VIN. In this case, the input voltage VIN is 0.3125 volt, and the reference voltage VREF is ¼ volt, namely the input voltage VIN is larger than the reference voltage VREF, thus the output COMP of the inverter 1 is "1", which is sent to the successive approximation register 3 to be stored therein. The value of the second bit is determined to be "1"in this procedure.

The similar procedures are repeated for the identifying lower bits. The input voltage VIN (0.3125 volt) is successively compared with the reference voltage VREF, which is ⅜ (=½+¼+⅛) volts in the third procedure and is ⁵⁄₁₆ (=½+¼+⅛+¹⁄₁₆) volts in the fourth procedure. The outputs COMP at the third and fourth procedures are "0" and "1", respectively, which are sent to the successive approximation register 3 and stored therein.

The signal TZ from the A/D clock generating block 12 is explained below.

FIG. 40 shows a block diagram of an A/D clock generating block 12. A clock signal CK, which is the source clock signal of the A/D converter, is frequency divided by a frequency divider 101 to supply a clock signal CK' to an A/D control signal generating circuit 102. The A/D control signal generating circuit 102, which is controlled by the signal CK', generates a control signal TZ to supply to the successive approximation register 3.

FIG. 32 shows an example the frequency dividing circuit 101. The ENABLE signal in the figure is a signal to actuate the A/D converter. When this signal becomes "H", the A/D converter begins its operation. The frequency dividing circuit 101 generates the control signal CK', by dividing the clock signal CK, and sends it to the A/D control signal generating circuit 102. The A/D control signal generating circuit 102 is provided with two sets of latch A 103 and latch C 104, as shown in FIG. 33.

FIG. 34 and FIG. 35 show an example of the circuit of the latch A 103 and the latch C 104, respectively, which generate the signal TZ. FIG. 41 is a timing chart of signals in the A/D clock generating block 12, showing how the signal TZ is generated.

While the ENABLE signal is "L", the A/D converter is not actuated. When the ENABLE signal turns to "H" in the time section T1 shown in FIG. 39, the A/D converter begins its procedure. According to the signal CK', signals at the points a,b,c,d,e in FIG. 33 are obtained. The timing clock signal TZ is the inverse of the signal at the point a. The A/D converter is controlled by this timing clock signal TZ, which has a constant period.

The successive approximation register 3 in FIG. 38 is explained below.

The successive approximation register 3 is controlled by the control signal TZ from the A/D clock generating block 12. FIG. 36 shows a block diagram of an example of the successive approximation register 3. The successive approximation register 3 comprises four shift registers, four latches 107 for storing the data of the COMP signal, and four output portions 108 for outputting the data in the latches 107 according to a read signal READ. The shift registers are comprised of a shift register 105 for the first bit, and three shift registers A 106 for the lower bits. The shift register 105 and the shift registers A 106 output control signals 1S–4S to the latches 107. The control signals 1S–4S determine a latch 107 in which the COMP signal shall be stored. The output portions 108 read out the data stored in the latch 107, according to the read signal READ, and provide them onto the data bus.

FIG. 37 shows a time chart of outputs of the shift registers 105 and 106. The bit latch control signals 1S–4S, which are outputs of the shift registers 105, 106, become "H" successively. Each latch 107 corresponds to one of the shift registers 105, 106. A shift register which is in the state "H" enables the corresponding latch to store and to latch a signal.

There are many other documents which disclose common methods for controlling a successive approximation type A/D converter. JP A 2-159814 discloses an idea to selectively adjust the TURN ON periods of the input switches in order to improve the preciseness of the A/D conversion. JP A8-288847 discloses an idea to set the initial charging time independently from the comparison period in order to improve the speed of A/D conversion. JP A 6-120828 discloses an idea to change the time constant of the charging of the capacitor in order to shorten the time for A/D conversion. JP A 9-321624 discloses an idea to previously charge the capacitor in order to speed up the A/D conversion. JP A 64-65928 and JP A 62-298230 disclose switching comparators.

The conventional method for controlling an A/D converter uses a clock signal TZ having a constant period for controlling the semiconductor switches 9–11 and the successive approximation register 3. The time required for the A/D conversion is mainly determined by the bit number multiplied by the sum of the longest charging time and the longest comparison time. In the charging of the capacitor by the input voltage VIN, the first charging is the longest charging time. On the other hand, when the difference between the former reference voltage and the present reference voltage increases, the time required for the stabilization of the reference voltage is longer. Thus the longest comparison period is a result of the larger difference of the reference voltages.

In the case that the reference voltage is generated using ladder resistors 4, for example, 10 bits 1:8 type A/D converter, the stabilization of the reference voltage requires a long time, when the reference voltage for higher bits is changed to that for lower bits. And for the other steps, long time is not required. However, in the common methods for controlling an A/D converter, the control signal for the semiconductor switches 9–11 and the control signal TZ for the successive approximation register 3 are clock signals with a constant period. As has been mentioned, in general, the A/D conversion time is determined by the longest charging time and the longest comparison time. Thus, in the common method for controlling an A/D converter, there is a lot of wasted time.

In order to shorten A/D conversion time, many ideas are proposed: for example, the speeding up of the response of the chopper amplifier, the use of a higher frequency for the source clock, the use of lower resistance ladder resistors, the use of a smaller capacitance for the capacitor, and the use of a plurality of comparators.

However each of the above entails the following drawbacks.

When the response speed of the chopper amplifier is made higher so as to shorten the conversion time, the size of the transistors must be large, this leads to a larger consumption of the electric power.

Also a chopper amplifier with higher response speed is sensitive, thus it has a tendency to be influenced by noises. In order to reduce the influence of the noises, the configuration of the layout pattern or the structure of the electric circuit shall be changed to use a larger area in the substrate. When a larger area is used, noises generated by the circuit become larger, and the consumption of the electric power also increases. Moreover the increase of the consumption of electric power requires an increase of the width of the lead lines, this leads to an increase in layout pattern area, in turn.

In a successive approximation type A/D converter, the frequency of the clock oscillation cannot be made higher than the frequency corresponding to the charging time. Thus there is a limit for increasing the frequency.

When the resistance of the ladder resistors 4 is made smaller for reducing the converting time, the current in the ladder resistors increases, this leads to an increase in consumption of the electric power.

There is a limit to miniaturization technology to reduce the capacitance of the capacitor (capacitor 1 in FIG. 38) in the chopper amplifier, and the influence of the stray capacitances cannot be neglected.

Use of a plurality of comparators for shortening the comparison time demands an increase in layout area and an increase in the consumption of electric power. Additionally, a matching between the comparators is required, and a complex controller for them is necessary.

SUMMARY OF THE INVENTION

An object of the present invention is to eliminate these drawbacks.

Another object of the present invention is to propose a method for speeding up A/D conversion, using a technique which is entirely different from the conventional speeding up technique, and to propose a method for controlling an A/D converter so as to shorten the time for the successive comparison and so speed up the A/D conversion.

The object is attained by a method for controlling an A/D converter, in which the period of a control signal is changeable for each comparison section, and the comparison between the reference voltage and the input voltage for identifying the digital value of the corresponding bit is carried out under the control of the period changed control signal.

In an embodiment, a clock signal is frequency divided by a plurality of frequency dividers to generate a plurality of timing signals having different periods; and the period of the control signal is changed by selecting one of the timing signals for each comparison section.

In an embodiment, an external signal for each comparison section is generated outside the analog/digital converter; and the period of the control signal is changed by using the external signal.

In an embodiment, a clock signal is frequency divided by a plurality of frequency dividers to generate a plurality of timing signals having different periods; a software program sets a value in a control register for each comparison section; and the period of the control signal is changed by selecting one of the timing signals for each comparison section, according to the set value in the control register.

In an embodiment, a set of signals having a different duty ratio is generated; and the period of the control signal is changed by selecting a signal from them for each comparison section.

In an embodiment, a set of signals having a different duty ratio is generated; a software program sets a value in a control register for each comparison section; and the duty ratio of the control signal is changed by selecting one of the signals for each comparison section, according to the value in the control register.

BRIEF DESCRIPTION OF THE DRAWING

FIG. 26 shows a timing chart of signals in the control signal setting register of the fourth embodiment.

FIG. 39 shows a timing chart of the signals in the A/D conversion according to the method of the successive approximation of the prior art.

DETAILED DESCRIPTION OF THE PREFERRED EMBODIMENT

Embodiment 1

Figure 1:
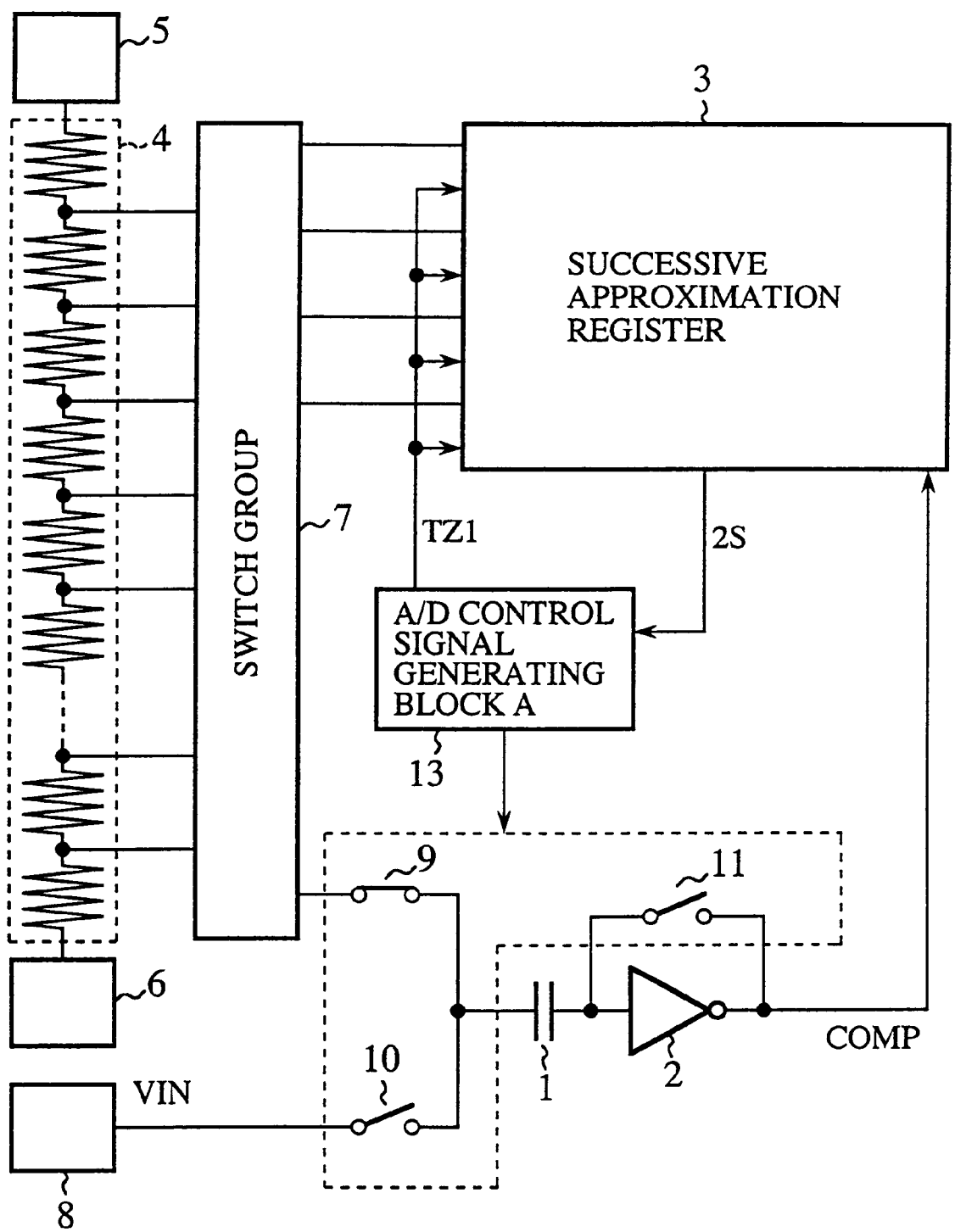
FIG. 1 shows a block diagram of an A/D converter, in which the method for controlling a successive approximation type A/D converter according to the first embodiment is applied.

FIG. 1 shows a block diagram of an A/D converter, in which the method for controlling a successive approximation type A/D converter according to the present invention is applied. This example is a 4 bits A/D converter.

Reference numeral 1 denotes a capacitor forming a chopper type comparator for comparing the reference voltage VREF and the input voltage VIN. A terminal of the capacitor 1 is connected with the input terminal of an inverter 2, which forms the chopper type comparator together with the capacitor 1. The output COMP of the comparator is sent to a 4 bit successive approximation register 3. Four registers in the successive approximation registers are set or reset by the signal COMP.

Reference numeral 4 denotes a ladder resistor having a plurality of resistors connected in series. For example, a 4 bit A/D converter has ladder resistor having 16 resistors. A standard voltage V is given from the both end terminals 5,6 of the ladder resistors 4. The standard voltage is the maximum voltage that the A/D converter can convert to a digital signal. Each connecting point between the resistors is connected with a switch in the switch group 7. The number of the switches in the switch group 7 corresponds to the number of the connecting points. There are 15 switches in the switch group of 4 bits A/D converter. The switches in the switch group 7 are controlled by the output data of the successive approximation register 3 so that a switch in the switch group is selected to turn on, to output a divided voltage as reference voltage VREF. Namely, the switch group selects a divided voltage of the standard voltage. In other words, the ladder resistors 4 and the switch group 7 function as an D/A converter to convert a digital output of the successive approximation register 3 to an analog voltage signal VREF.

Reference numeral 8 denotes an input terminal for an input voltage VIN, which is to be converted to an analog signal. The reference voltage VREF is imposed to the capacitor 1 through a semiconductor switch 9. The input voltage is imposed to the capacitor 1 through a semiconductor switch 10. The input side and the output side of the inverter 2 can be electrically connected through a semiconductor switch 11 for preparing the charging of the capacitor 1. The switches 9,10,11 are transistor switches, for example, FET switches.

An A/D control signal generating block A 13 generates a timing signal for controlling the semiconductor switches 9,10,11 to turn on or to turn off them, and a control signal (hereinafter called TZ signal), which controls the timing of the data delivery from the successive approximation register 3 to the switch group 7.

The function of the A/D converter in FIG. 1 is explained below.

Figure 2:
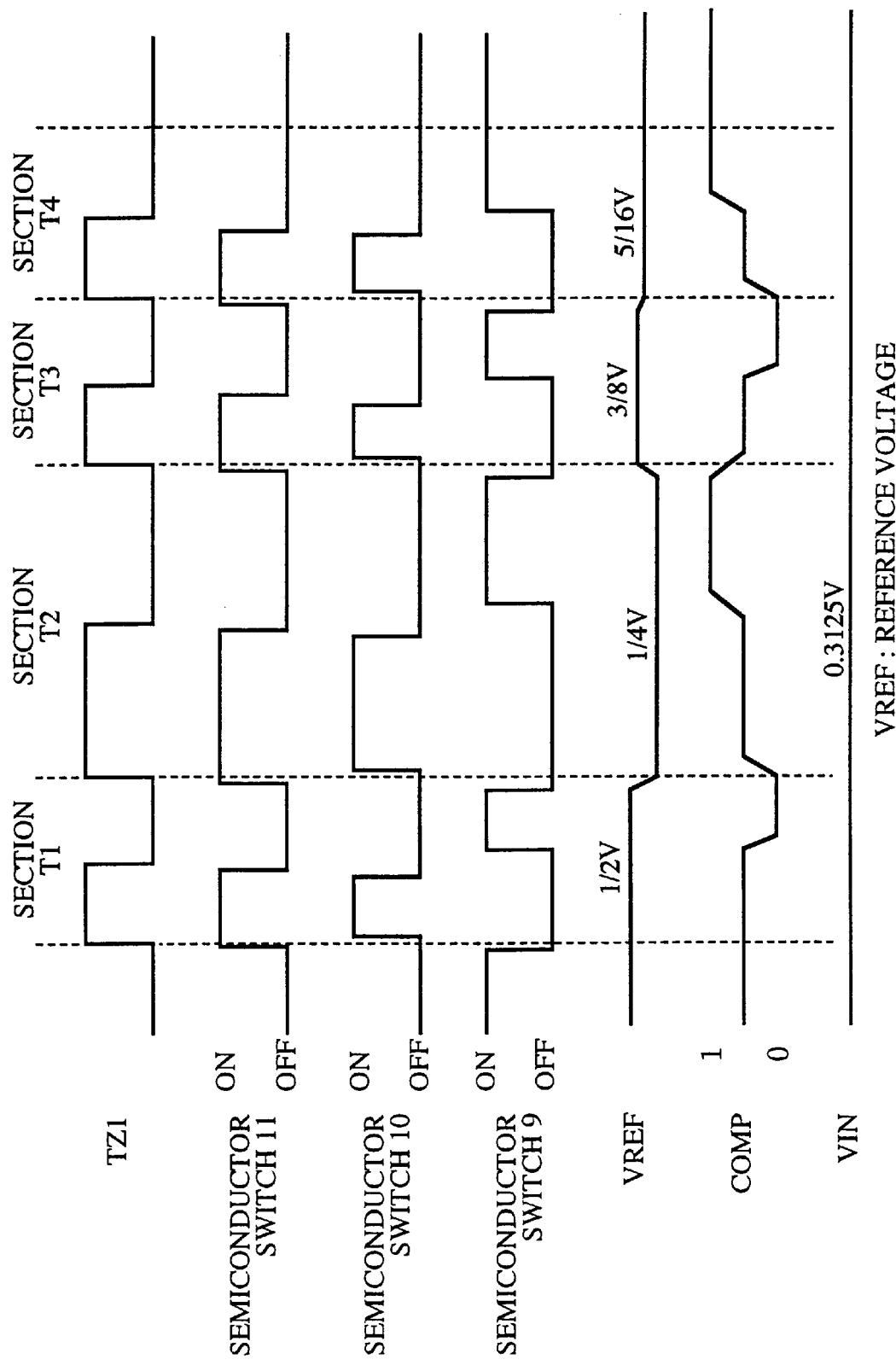
FIG. 2 is a timing chart of the signals in the A/D converter of FIG. 1, which is controlled by the method according to the first embodiment of the present invention, having a sample-hold function.

FIG. 2 is a timing chart of the signals in the A/D converter of FIG. 1, which is controlled by the method according to the first embodiment of the present invention. FIG. 2 is an example for the case that the standard voltage V is 1 volt, the input voltage VIN is 0.3125 times of the standard voltage, namely 0.3125 volt, and the input voltage is converted to a 4 bit digital signal.

Figure 38:
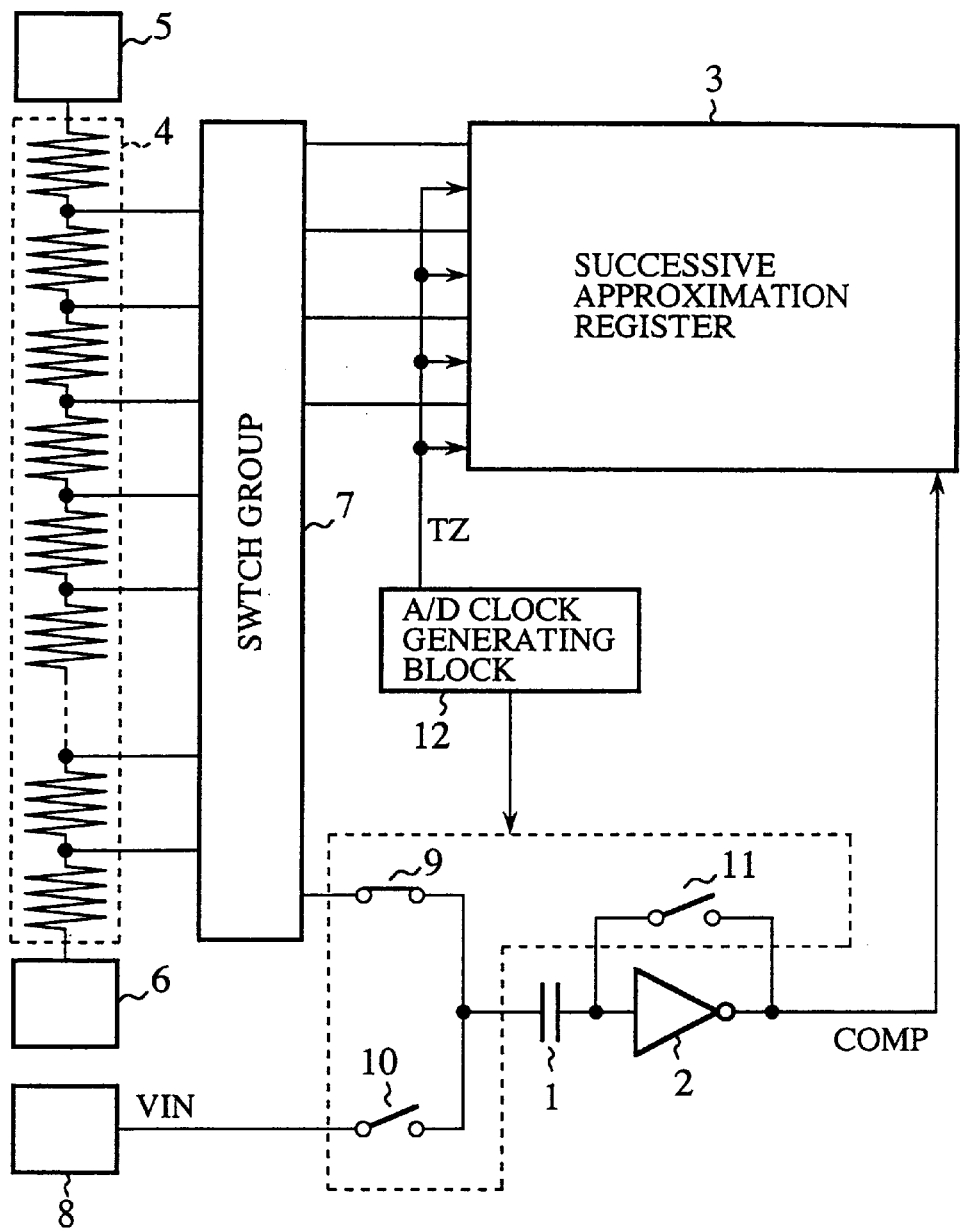
FIG. 38 shows a block diagram of an A/D converter of the prior art.
Figure 40:
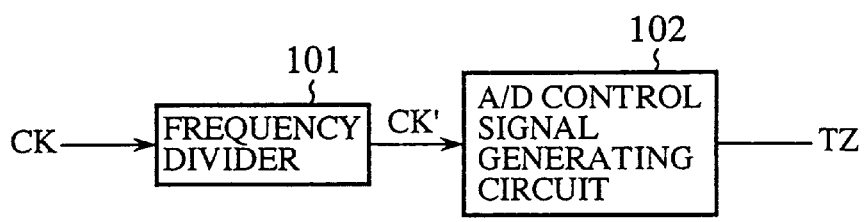
FIG. 40 shows a block diagram of A/D clock generating block of the prior art.
Figure 41:
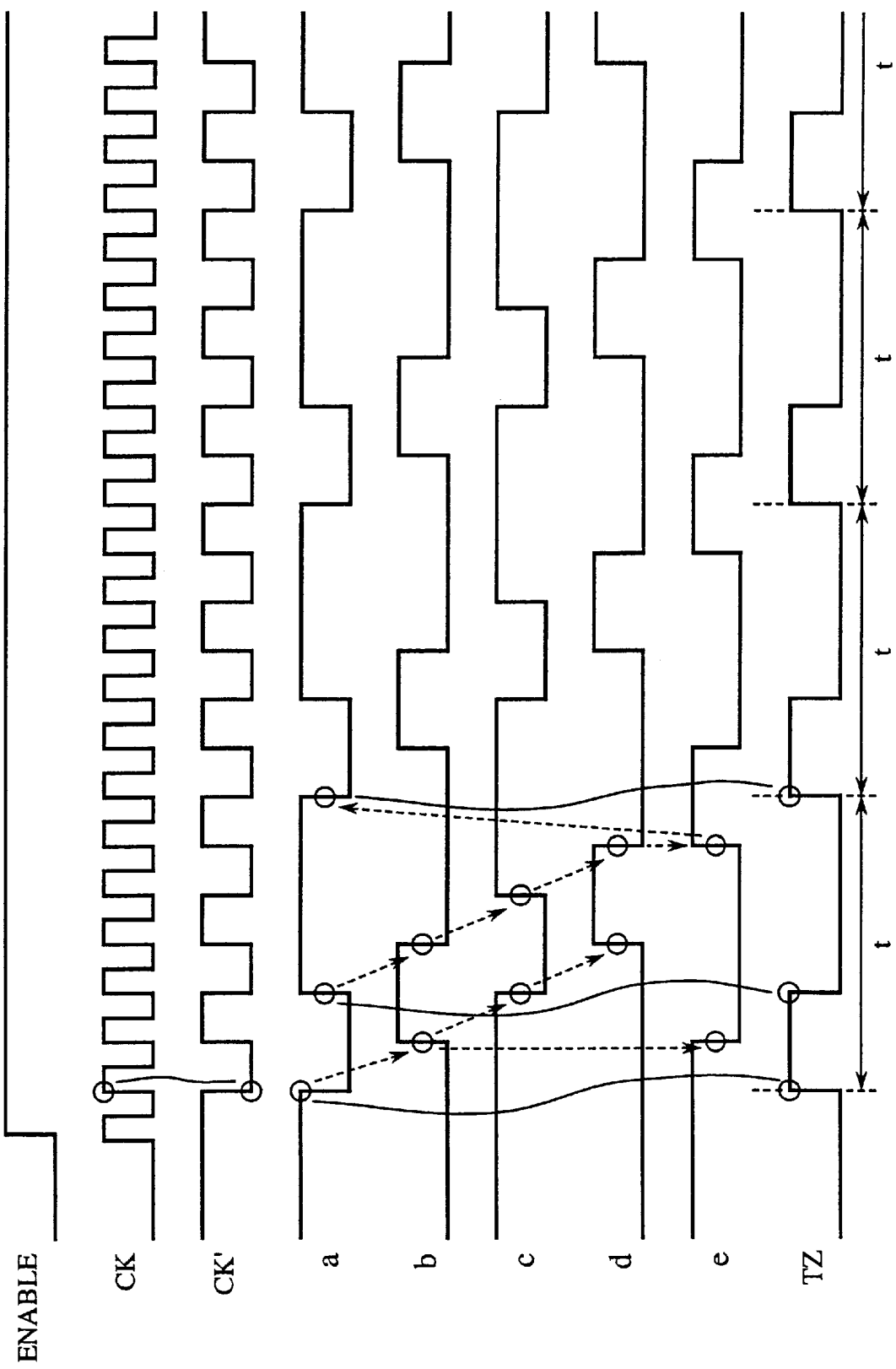
FIG. 41 shows a timing chart of the signals in the A/D clock generating block of the prior art.

At the beginning of the conversion procedure, the A/D control signal generating block A 13 generates a timing signal to turn off the semiconductor switch 9, in the same manner as the A/D clock generating block 12 in the common method in FIG. 38. Then the block A 13 sends a signal TZ1 to the successive approximation register 3 so that the register 3 delivers the digital data stored in it to the switch groups 7. In the time section T1, in which the first bit is identified, "8h" in hexadecimal is previously stored in the successive approximation register 3.

The standard voltage V is divided by 16 resistors to 16 equidistant voltages, and the switch group is controlled by the data "8h" from the successive approximation register 3 to select the eighth switch in the 15 switches so that only the eighth switch turn on. And, it outputs ½ volts as a reference voltage VREF, which is generated by the ladder resistors 4.

A/D control signal generating block A 13 sends another timing signal to the semiconductor switch 11 so that it turns on. When the semiconductor switch 11 turns on, the input side and the output side of the inverter are electrically connected, and they become an equal voltage V0, which is determined by the input and output characteristics of the inverter 2. An end of the capacitor 1 has the voltage V0. Next, the semiconductor switch 10 turns on, according to another signal from the block A 13. When the semiconductor switch 10 turns on, the input voltage VIN is imposed to the other end of the capacitor 1, as a result, the capacitor 1 is charged by the difference voltage between the input voltage VIN and the voltage V0. After charging up the capacitor 1, the semiconductor switch 10 turns off, according to another signal from the A/D control signal generating block A 13. Successively the semiconductor switch 11 turns off, according to another signal from the block A 13.

After that, the A/D control signal generating block A 13 sends the next timing signal to the semiconductor switch 9 to turn it on. The reference voltage VREF is imposed to the capacitor 1 through the semiconductor switch 9. And the reference voltage VREF and the input voltage VIN is compared by the capacitor 1 and the inverter 2, which form a comparator. In this case, the reference voltage is ½ volts and the input voltage VIN is 0.3125 volts, namely VIN<VREF, thus the output of the inverter 2 is "0". This output, signal COMP, is sent to the successive approximation register 3. The successive approximation register 3 rewrite its storing data from "8h" to "4h" in hexadecimal, after receiving the signal COMP.

The A/D control signal generating block A 13 begins the procedure of identifying the second bit, and sends a new timing signal to the semiconductor switch 9 so that it turns off. Then the block A 13 sends a signal to the successive approximation register 3 so that it transfers its storing data to the switch group 7. The switch group 7 is controlled by the digital data from the block A 3 to select the voltage of ¼ volts, which corresponds to "4h", from the divided voltages by the ladder registers 4, and outputs it as a reference voltage VREF.

After this procedure, the block A 13 sends a signal to the semiconductor switch 11 to turn on so that its input side and its output side have an equal voltage. Then the block A 13 sends another signal to the semiconductor switch 10 to turn on so that the capacitor 1 is charged by the input voltage VIN.

After turning off the semiconductor switch 10, the A/D control signal generating block A 13 sends a signal to the semiconductor switch 9 to turn on so that the reference voltage VREF is imposed to the capacitor 1. The reference voltage VREF and the input voltage VIN are compared by the comparator, which is comprised of the capacitor 1 and the inverter 2. In this case, the reference voltage is ¼ volts, and the input voltage is 0.3125 volts, namely VIN>¼ volts, then the output COMP of the inverter 2 is "1". The signal COMP is sent to the successive approximation register 3, which rewrite its storing data from "4h" to "6h".

These steps are repeated in the procedures for identifying the third and fourth bits. In the procedure for identifying the third and fourth bits, the input voltage VIN is compared with the reference voltages VREF of ⅜ volts and ⁵⁄₁₆ volts, and the signals COMP of "0" and "1", respectively, are sent to the successive approximation register 3. Finally the register 3 rewrites its storing data to "5h" and outputs it. This is the result of the A/D conversion.

In the steps for the A/D conversion, the charging time at the section T2, which corresponds the procedure for identifying the second bit, requires the longest time. The charging times at the sections T1, T3, T4 are shorter than that of the section T2. Thus the time for A/D conversion can be reduced by reducing the period at the sections T1, T3, T4. In this embodiment, the clock periods in these sections other than T2 is reduced by the below explained method for reducing the time for A/D conversion.

In this embodiment, the periods of the control signal in the sections other than T2 is made a half of the period in the section T2. However it shall be noted that it is not limited to this example, but it is only an example for the purpose of facilitating understanding. The important points are that the periods can be changed according to the time section, and how they can be changed according to the section. In each section, a procedure for identifying a bit value is carried out.

The signal TZ1, the output of the A/D control signal generating block A 13, is explained below.

Figure 3:
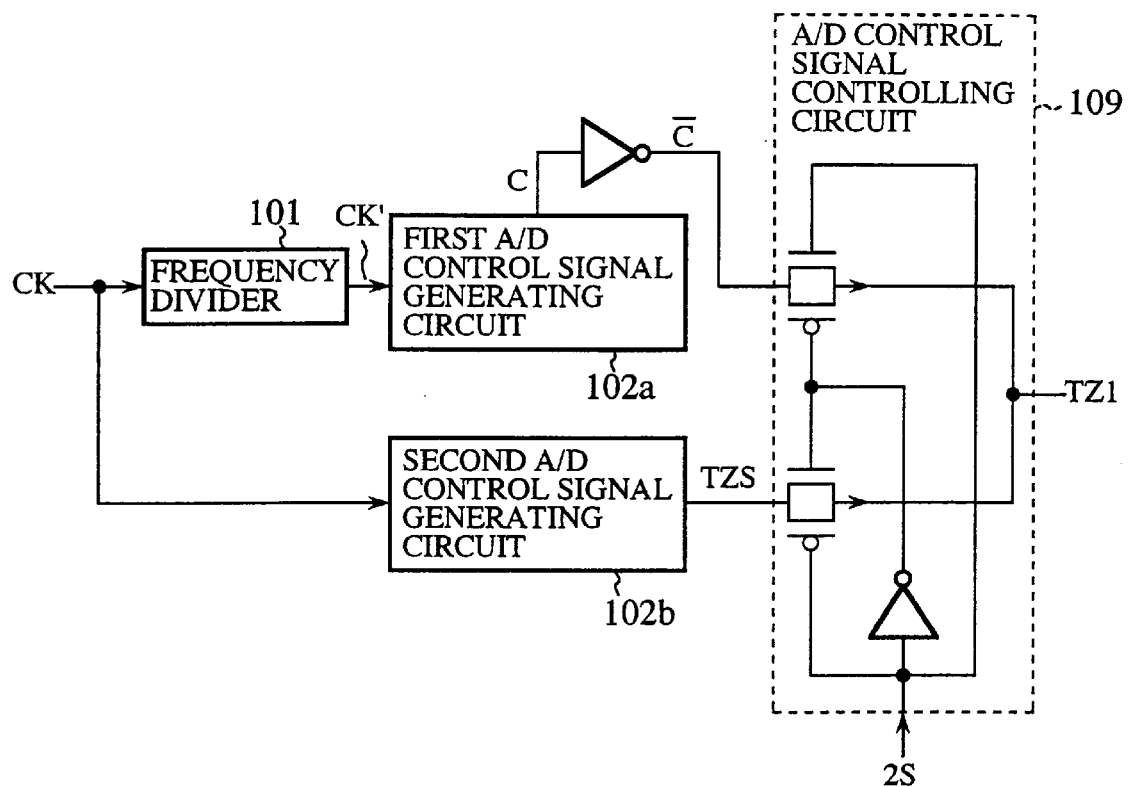
FIG. 3 shows a block diagram of an example of the A/D control signal generating block A in the first embodiment.
Figure 4:
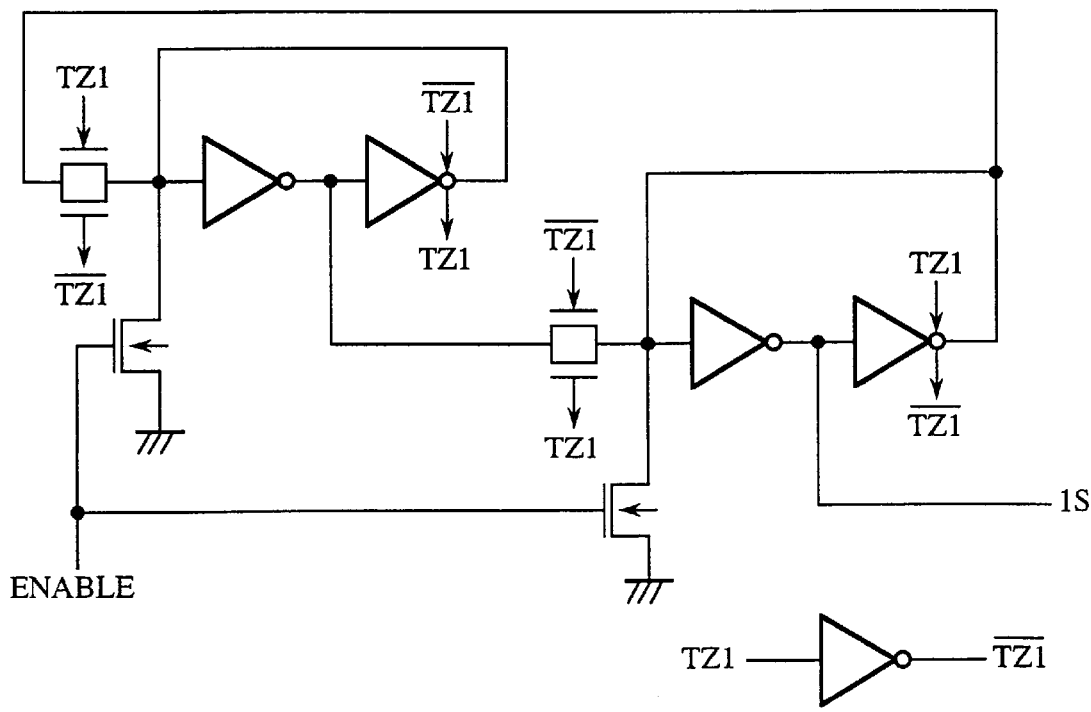
FIG. 4 shows an electric circuit of the shift register used in the successive approximation register in the first embodiment.
Figure 5:
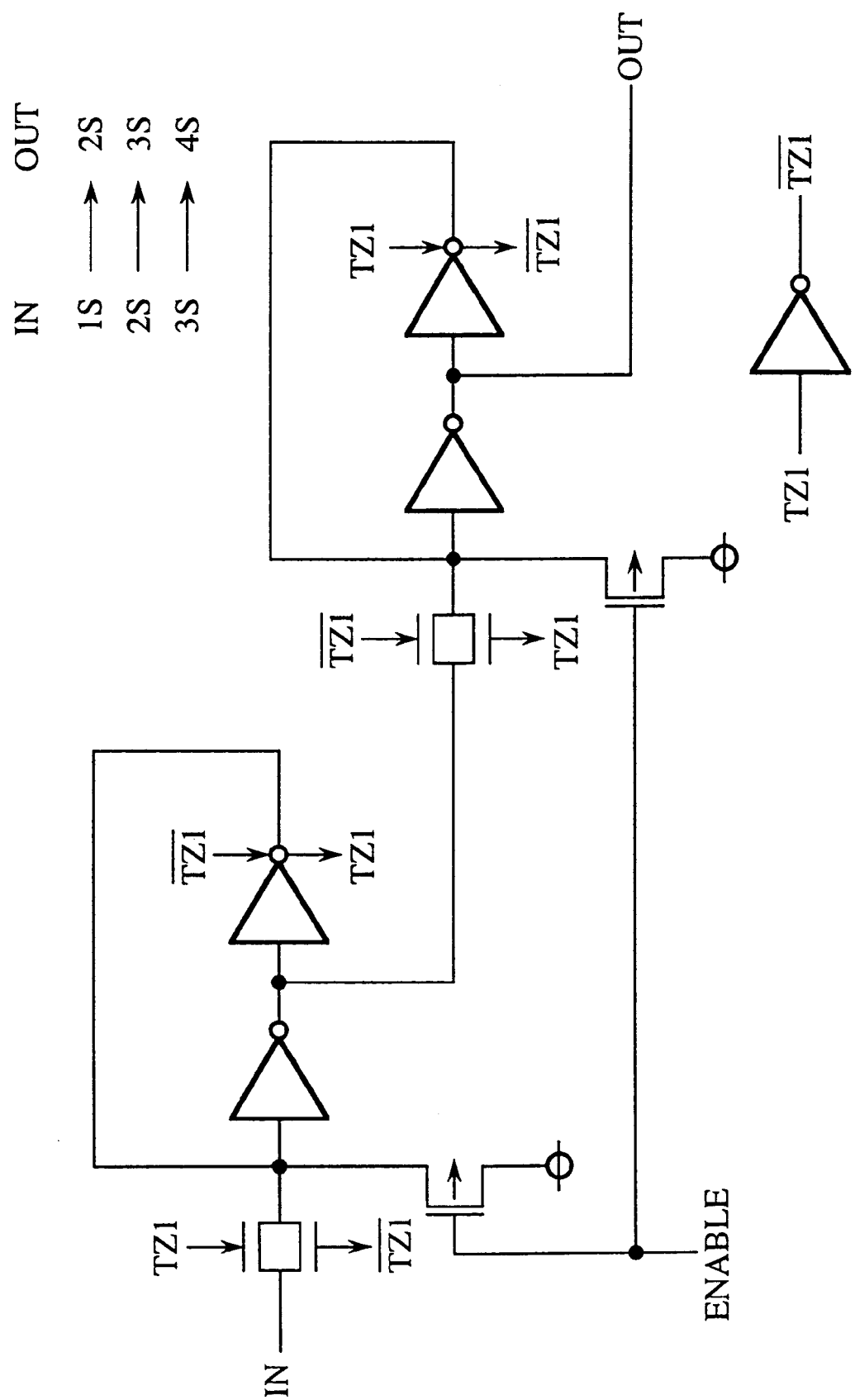
FIG. 5 shows an electric circuit of the shift register A used in the successive approximation register in the first embodiment.

FIG. 3 shows a block diagram of an example of the A/D control signal generating block A 13. The A/D control signal generating block A 13 is comprised of a frequency dividing circuit 101, a first and second A/D control signal generating circuits 102a, 102b and an A/D control signal controlling circuit 109.

Figure 33:
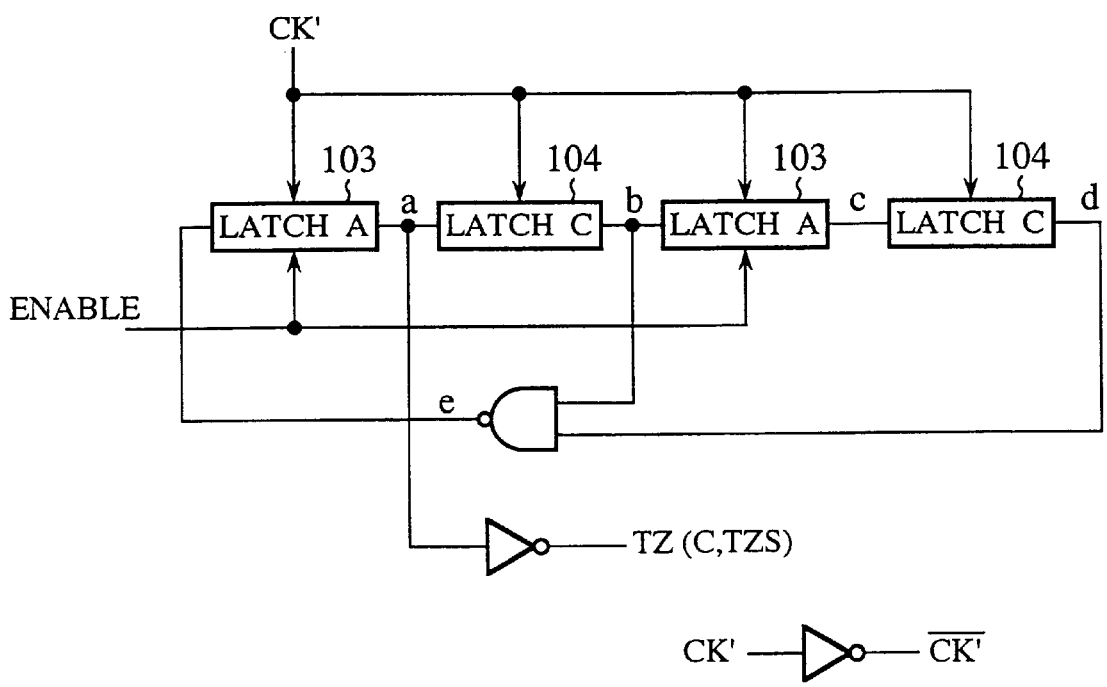
FIG. 33 shows an example of the A/D control signal generating circuit of the first and third embodiments as well as of the prior art.
Figure 32:
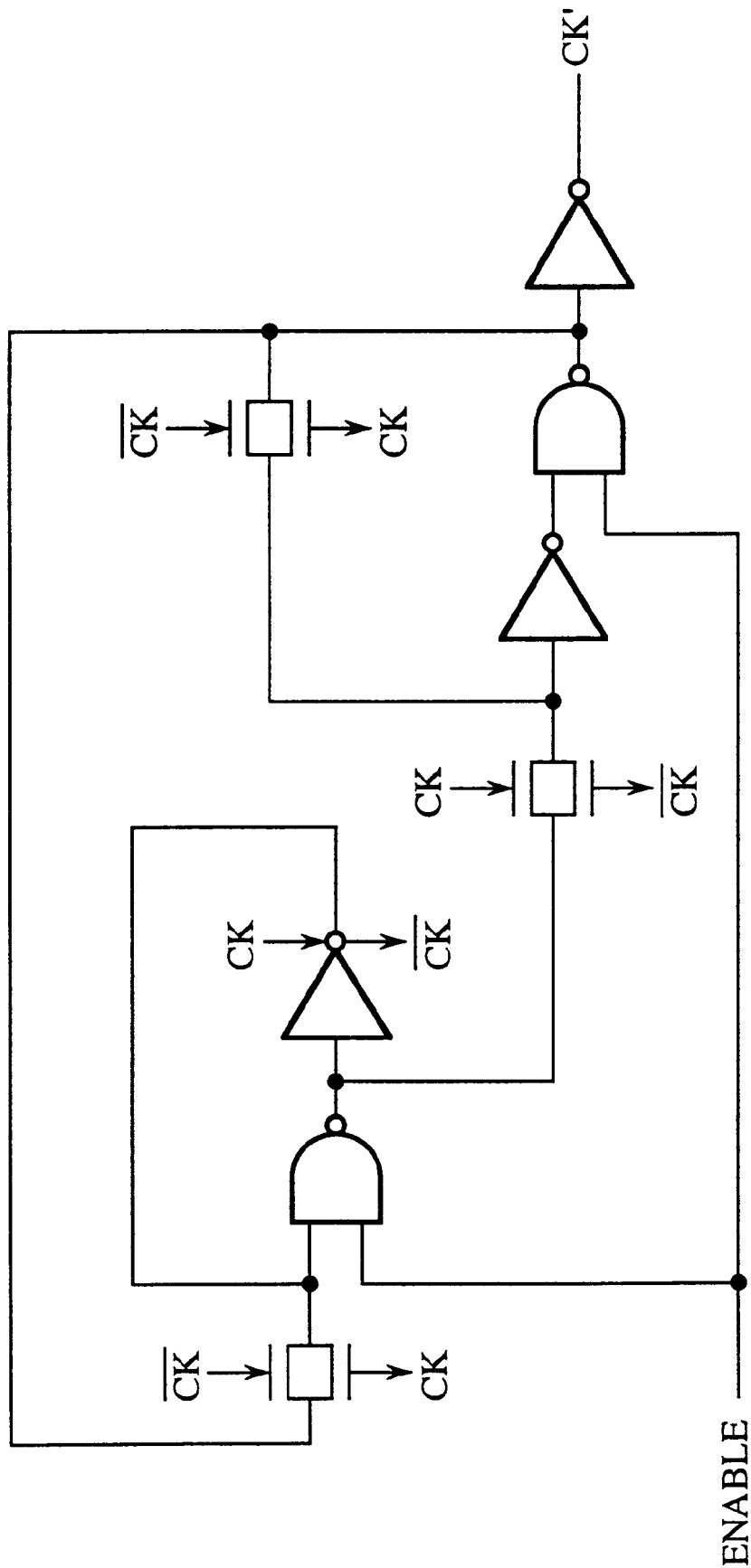
FIG. 32 shows an example of the frequency divider of the first embodiment as well as of the prior art.
Figure 34:
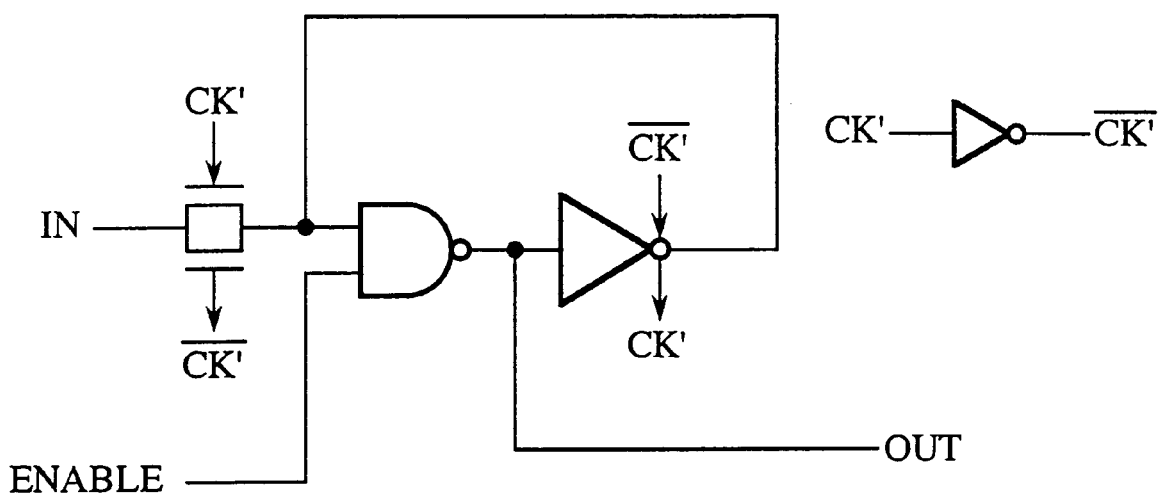
FIG. 34 shows an example of the latch A of the first embodiment as well as of the prior art.
Figure 35:
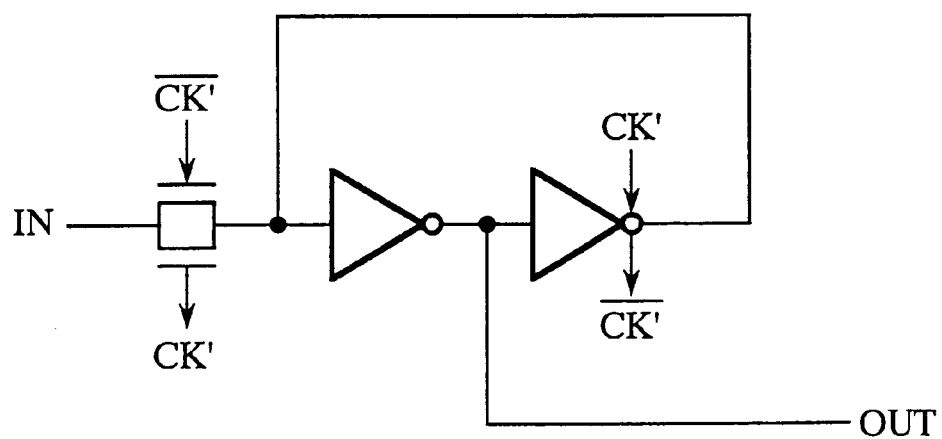
FIG. 35 shows an example of the latch C of the first embodiment as well as of the prior art.

An example of the frequency dividing circuit 101 is shown in FIG. 32. The signal ENABLE enables the A/D conversion procedure. When the signal ENABLE changes to "H", the A/D converter begins its operation. The frequency dividing circuit 101 divides the frequency of the source clock signal CK to generate another clock CK', which is sent to the A/D control signal generating circuit 102. The first A/D control signal generating circuit 102a generates a timing signal C from the clock signal CK' generated in the frequency dividing circuit 101. The signal C corresponds to the signal TZ in the conventional A/D converter in FIG. 38, The first A/D control signal generating circuit 102a has two sets of latches A 103 and latches C 104, as shown in FIG. 33. Examples of the latch A and the latch C are shown in FIG. 34 and FIG. 35, respectively. The first A/D control signal generating circuit 102a generates the output signal C, using the latches A and the latches C.

The signal TZS is a timing signal generated directly from the clock signal CK by the second A/D control signal generating circuit 102b. The period of the signal TZS is shorter than the signal C, which corresponds to the signal TZ in the conventional method, because it is not frequency divided by the frequency divider 101. Namely the period is a half of the period of the signal C.

The A/D control signal controlling circuit 109 selects one of the signals C and TZS, as an output of the A/D control signal generating block A 13. The A/D control signal controlling circuit 109 selects a signal C or TZS, according to the output signal 2S from the shift register A 106 in the successive approximation register 3.

The successive approximation register 3 is explained below.

Figure 36:
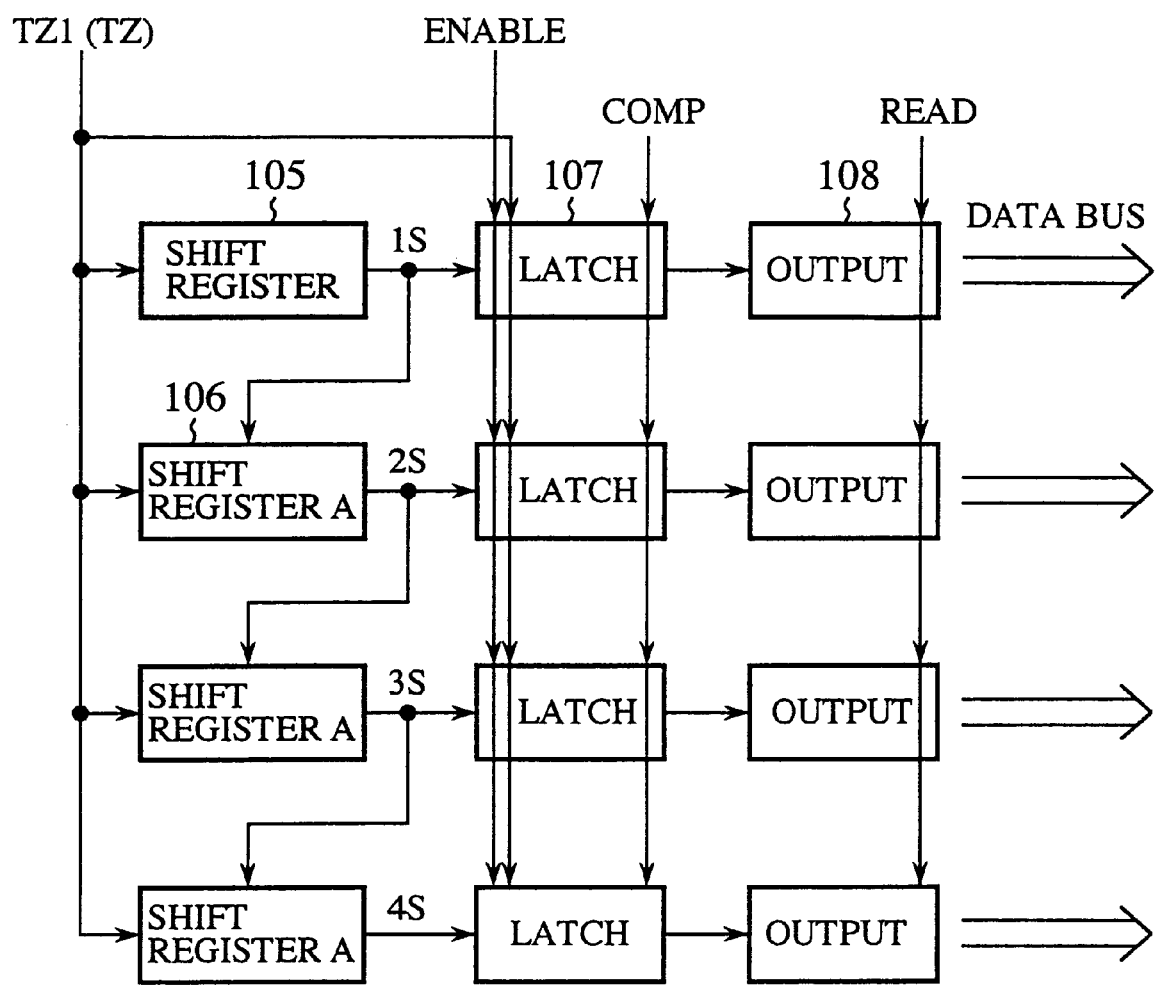
FIG. 36 shows a block diagram of the successive approximation register of the first embodiment and the prior art.

The successive approximation register 3 in the present invention is basically identical to that of conventional one shown in FIG. 38 which is referred by the same reference numerals. The successive approximation register 3 is controlled by the signal TZ1 from the A/D control signal generating block A 13. An example of the successive approximation register 3 is shown in FIG. 36. The shift register 105 and the shift register A 106 determine a data latch, in which the signal COMP shall be stored therein.

The shift register 105 controls the latch 107 for the first bit. The input of the shift register 105 is not an external signal, but is an internal signal. The shift register A 106 controls the latches 107 for the second to fourth bits. Their input is an external signal, which is the output of the upper shift register for the upper bit. The shift register 105 and the shift register A 106 are controlled by the clock signal TZ1 from the A/D control signal generating block A 13.

Figure 37:
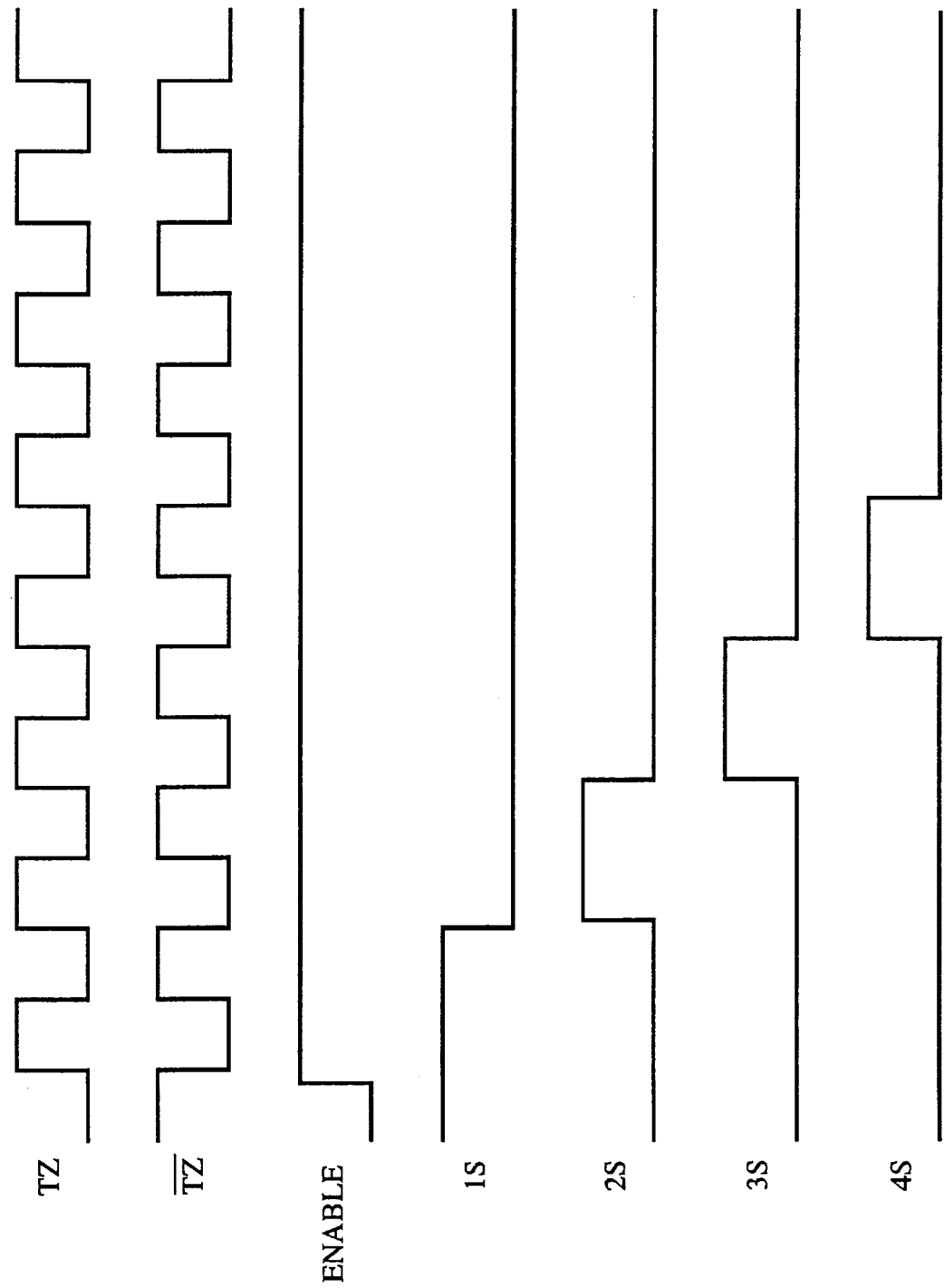
FIG. 37 shows a timing chart of the signals in the shift register of the first embodiment and the prior art.

FIG. 37 shows a timing chart of the outputs of the shift register 105 and the shift registers A 106. When an output 1S–4S of the shift register 105 or the shift register A 106 is "H", the corresponding latch 107 is actuated to store and latch the signal COMP. Namely the outputs 1S–4S of the shift registers 105, 106 are the control signals of the latches 107.

Figure 6:
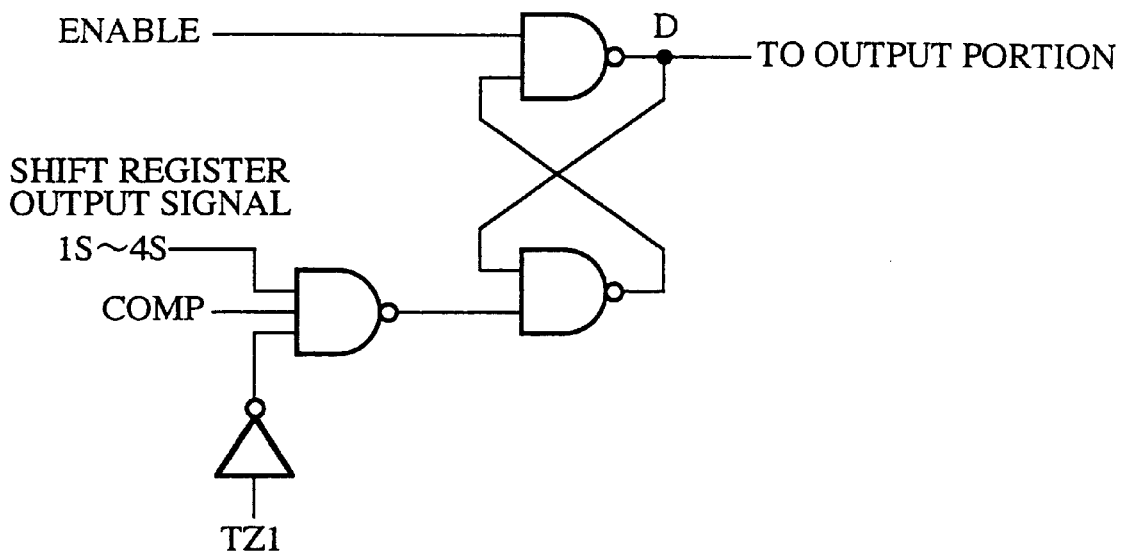
FIG. 6 is an electric circuit of the latch 107 used in the successive approximation register in the first embodiment.
Figure 7:
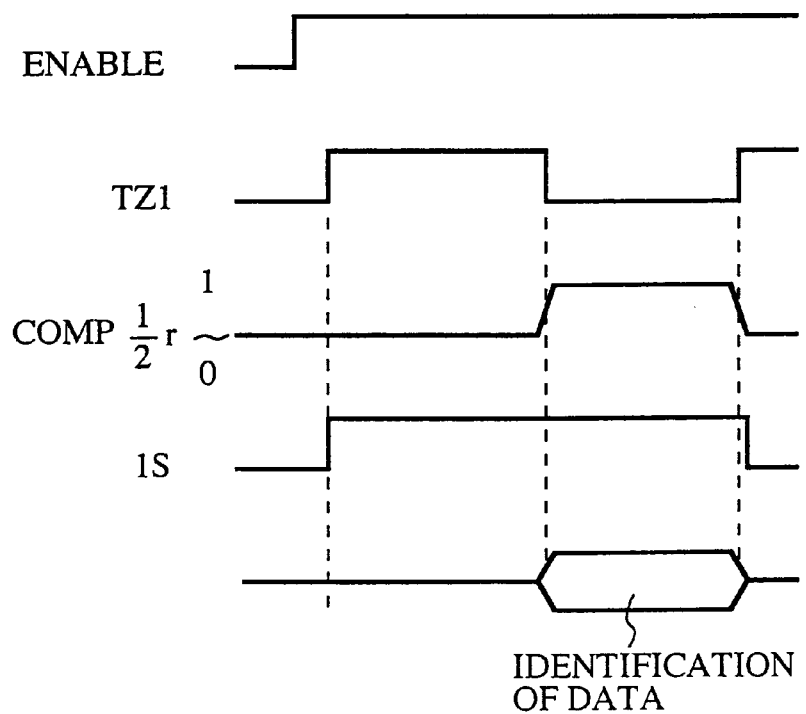
FIG. 7 shows a timing chart of signals in the latch circuit.

Latches 107 store the result of the A/D conversion for each bit. An example of the circuit of the latch 107 is shown in FIG. 6, and the timing chart of signals in the circuit is shown in FIG. 7. When the signal TZ1 from the A/D signal control signal generating block 13 changes from "H" to "L", the output COMP of the inverter 2 is stored in a latch 107, which corresponds to the shift register 105, 106 that outputs "H". The outputs of the shift registers are denoted "output 1S–4S". The stored dated in the latches 107 can be read through a reading portion 108 and is delivered to the data bus, according to a reading signal READ.

The number of the shift registers 105 (including shift register A 106), latches 107, reading portion 108 corresponds to the number of bits of A/D conversion. For example, in the 4 bits A/D conversion, 4 shift registers, 4 latches and 4 reading portions are provided.

Figure 8:
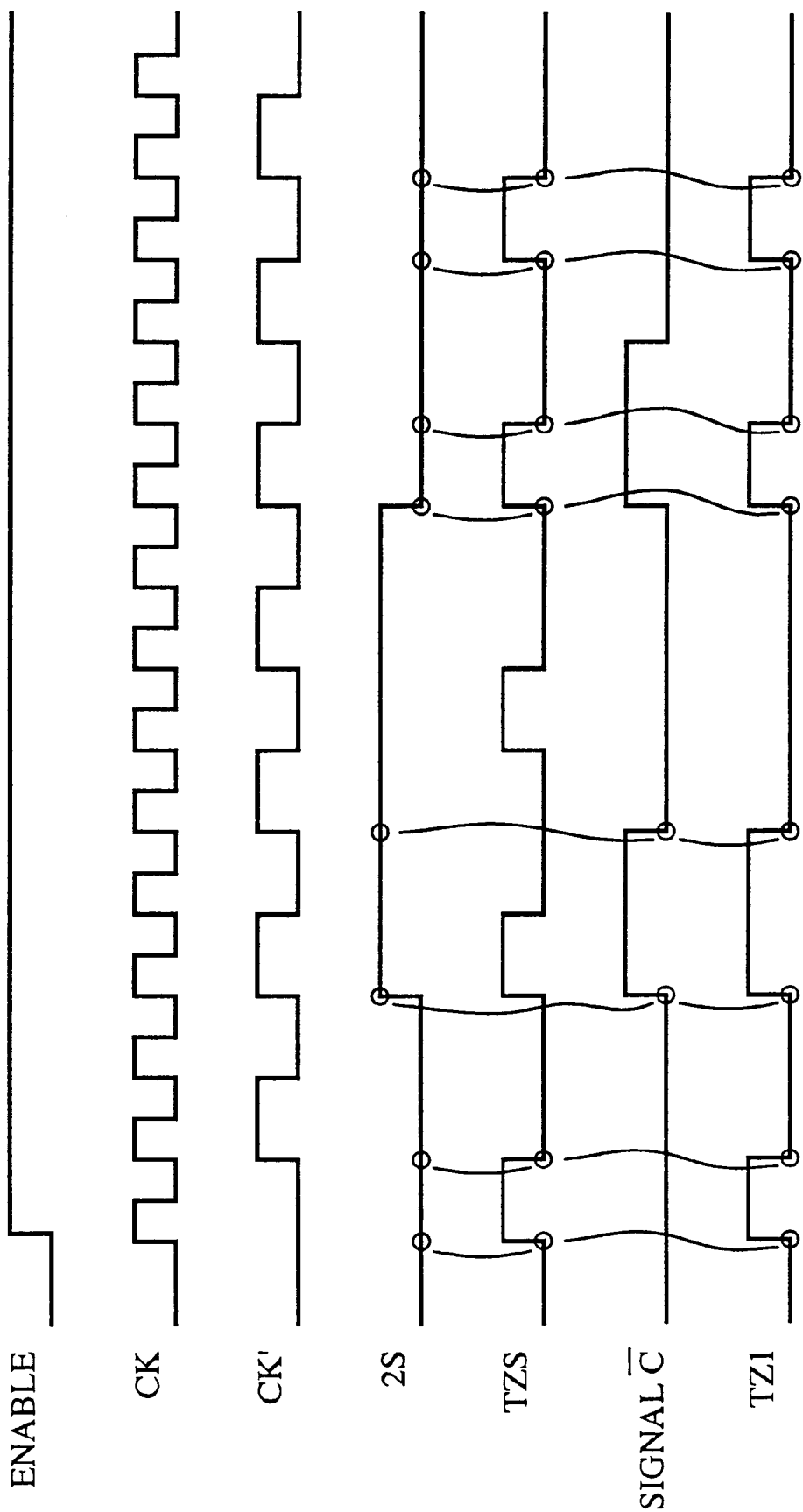
FIG. 8 is a timing chart of the signals in the A/D control signal generating block A in the first embodiment.

FIG. 8 is a timing chart of the signals in the A/D control signal generating block A 13, showing how the clock signals is exchanged. When the output signal 2S from the shift register A 106 in the successive approximation register 3 is "L", the signal TZS is selected as a clock signal TZ1. When the signal 2S is "H", the signal C generated from the signal CK', which is frequency divided, is selected as a clock signal TZ1. The period of the signal TZ1 when the output 2S is "L" is a half of the period when the output 2S is "H". The signal TZ1 generated in this way controls the A/D conversion as clock signal, and is sent to the successive approximation register 3.

The period at the section T2 which requires the longest charging time, is identical to the conventional method, however, the period at the other sections T1, T3, T4, which require rather shorter charging time, is reduced to a half of that at the section T2.

In summary, according to the first embodiment, the period of the control signal is reduced at the sections T1, T3, T4. The period of control signal at the section T2 which requires a longer time for stabilizing the reference voltage due to a rather larger difference voltage between the former and present reference voltages, is made longer than that at the other sections. Thus the sharing of the comparing times can be optimized, which leads to a speeding up of the A/D conversion.

The time for A/D conversion can be approximated by the following expression:

Conversion Time=Section T1+Section T2+Section T3+Section T4

In the conventional method,

Section T1=Section T2=Section T3=Section T4=T

Conversion time=4T

According to the first embodiment,

Section T1=Section T3=Section T4=T/2

Section T2=T

Conversion time is=(5/2)T

Consequently, in the first embodiment, the reduction ratio of time for A/D conversion compared to the conventional method is 37.5%.

Embodiment 2

In the first embodiment, the signal TZ1 is obtained by selecting a signal from signals C and CK, the former is generated from the signal CK', which is obtained by dividing the clock signal CK, and the latter is a signal generated directly from the clock signal CK. By using the control signal TZ1, the period of the control signal is changed for each bit. However, the period of the control signal can be changed using an external clock circuit, for example, a timer.

Figure 9:
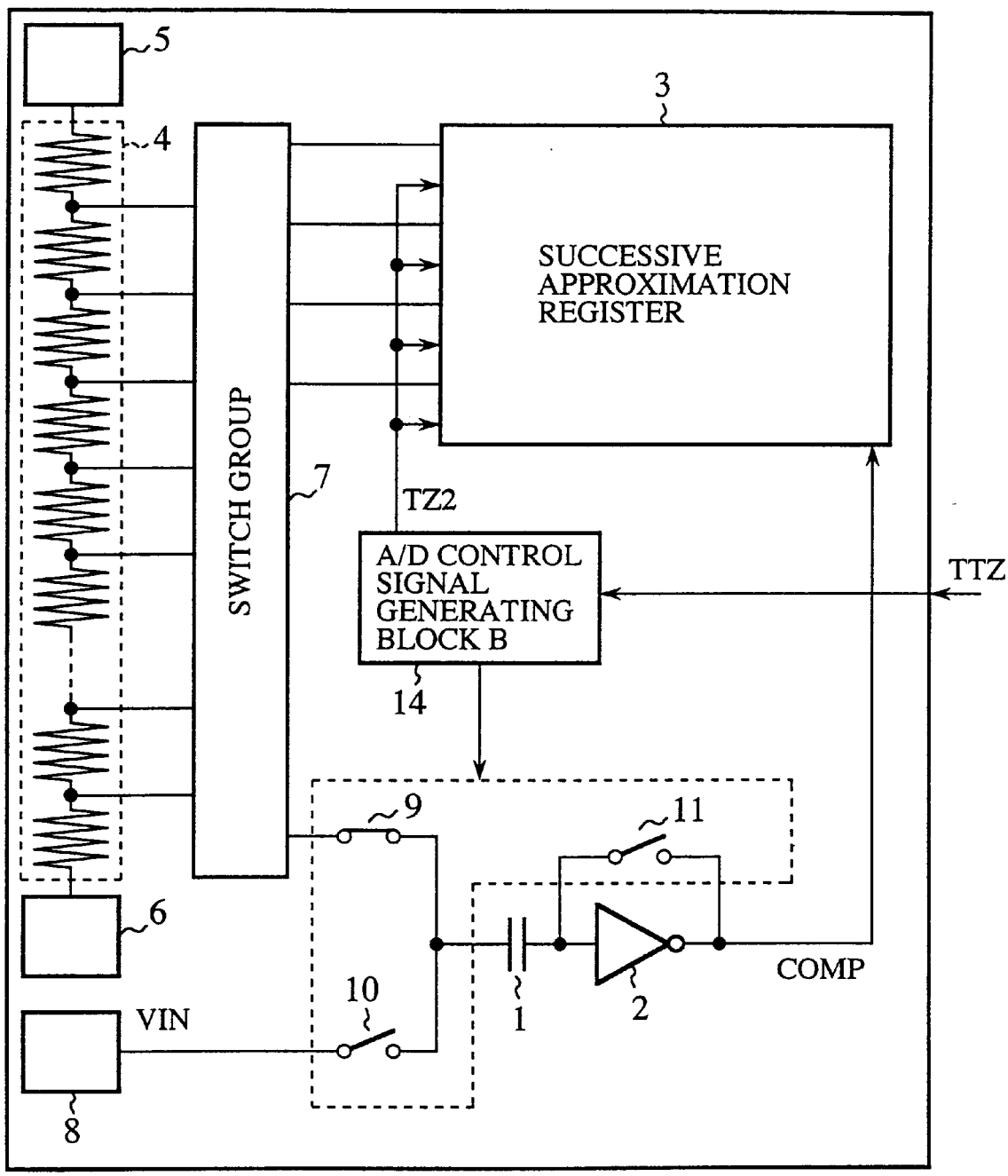
FIG. 9 shows a block diagram of an A/ID converter, in which the method for controlling a successive approximation type A/D converter according to the second embodiment of the present invention is applied.

FIG. 9 shows a block diagram of an A/D converter, in which the method for controlling a successive approximation type A/D converter according to the second embodiment of the present invention is applied. The elements in FIG. 9, which are identical or equivalent with elements in FIG. 1 are referred by the same reference numerals, and their explanation is omitted.

An A/D control signal generating block B 14 generates control signals for turning on or turning off the semiconductor switch 9, 10, and. 11, as well as a control signal (hereinafter called a signal TZ2) for determining the timing that the successive approximation register 3 delivers its data to the switch group 7. A TTZ signal generating circuit using a timer disposed outside the A/D converter generates a TTZ signal. The A/D control signal generating block B 14 generates the timing signal and the control signal TZ2, corresponding to the signal TTZ.

The function of the A/D converter is explained below.

Figure 10:
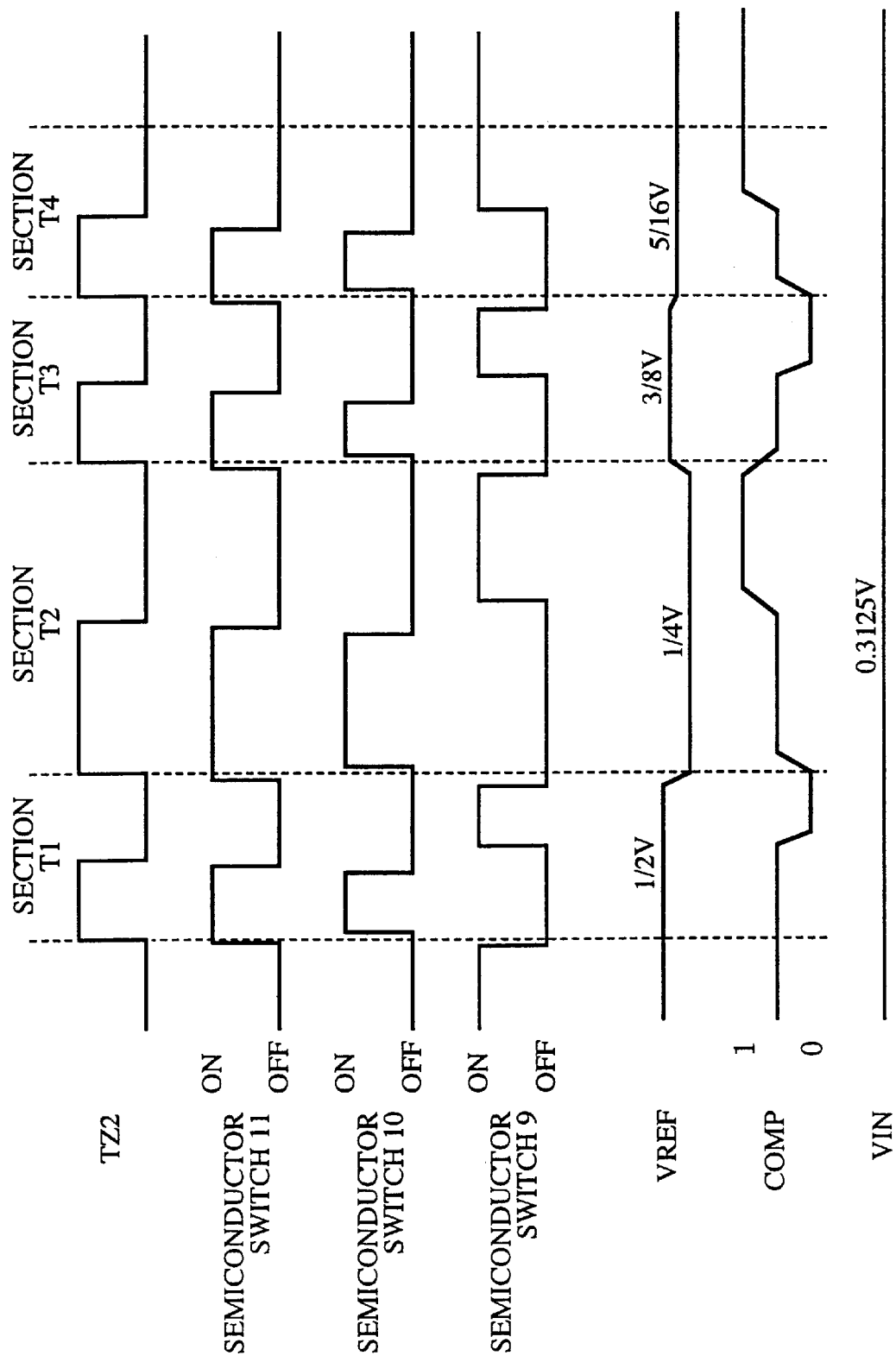
FIG. 10 shows a timing chart of the signals in the successive approximation type A/D converter in the second embodiment.

FIG. 10 shows a timing chart of the signals in the A/D converter of FIG. 9. The substantial function is identical to that of the first embodiment. In this example, the input voltage VIN of 0.3125 volts is applied to the input terminal 8, and the input voltage is converted to a 4 bit digital signal.

Figures 11, 12:
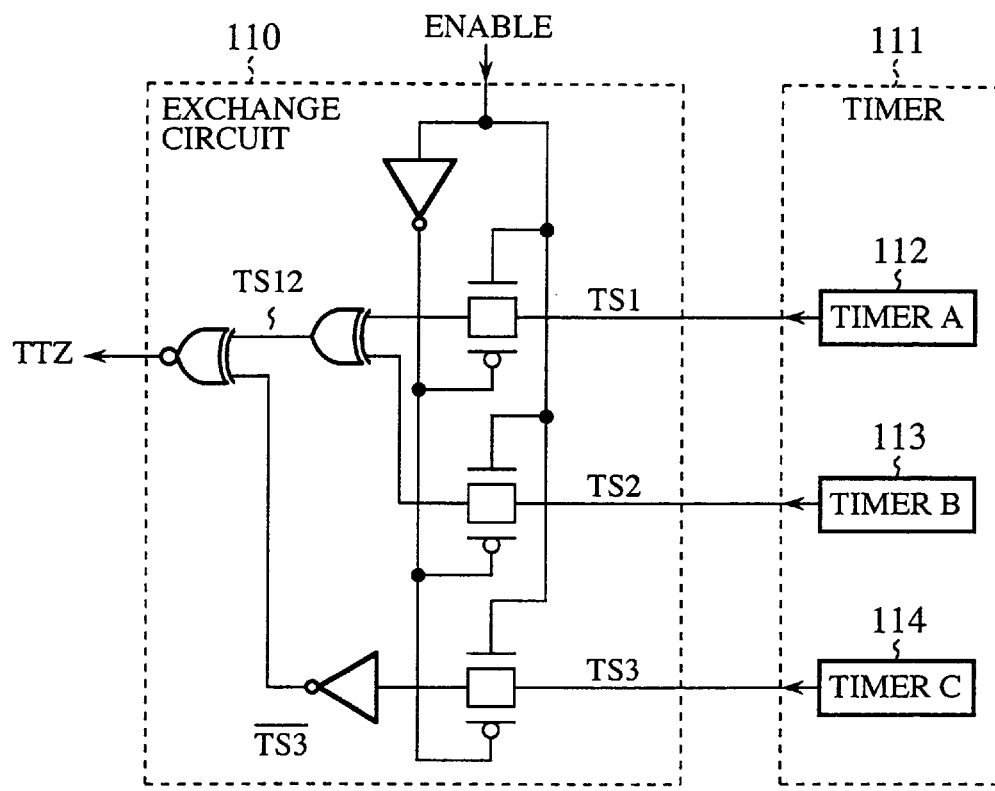
FIG. 11 shows a block diagram of TTZ signal generating circuit.
FIG. 12 shows an example of the function and the set value of the timers.

External timers 111 generates output signals TS1–TS3. An exchanging circuit 110 selects one of them to supply to the A/D converter of FIG. 9 as a signal TTZ, as shown in FIG. 11. The signal TZ2 to control the A/D converter is generated from the signal TTZ.

FIG. 11 shows an example of the circuit for generating the TTZ signal. The timer 111 in the circuit is composed of a timer A 112 for generating a signal TS1, a timer B 113 for generating a signal TS2 and a timer C 114 for generating a signal TS3. The outputs TS1–TS3 of these timers A 112, B 113 and C 114 are sent to the exchanging circuit 110.

FIG. 12 shows the function and the set value of the timers A 112, B 113 and C 114. As shown in the figure, the set value of the timer A 112 is "2", and the timer A counts down from the set value repeatedly to output an underflow signal, when an underflow occurs. The set value of the timer B is "4", and the timer B counts down from the set value only one time to output an underflow signal, when an underflow occurs. The set value of the timer C 114 is "6", and the function of the timer C is identical to the timer A.

Figure 13:
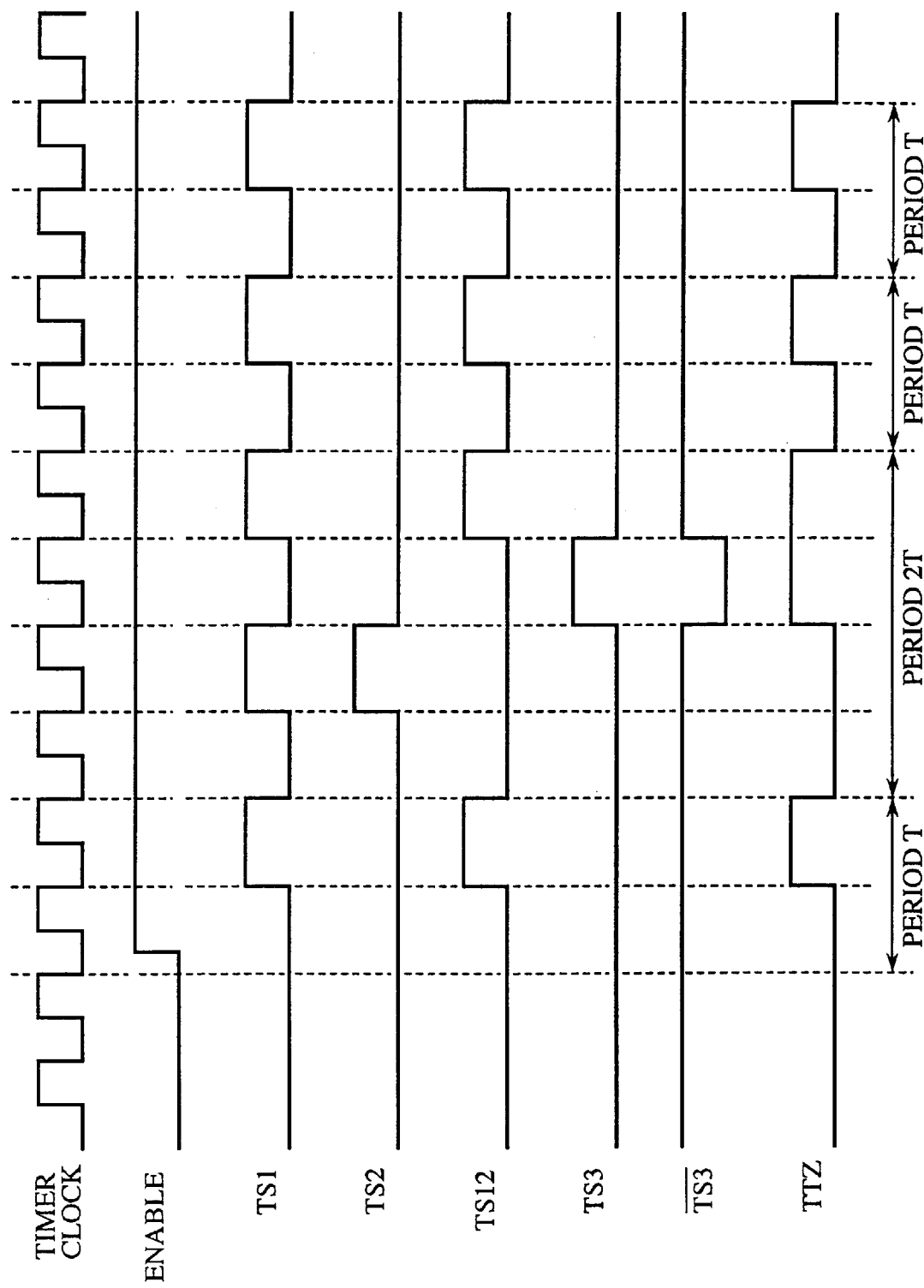
FIG. 13 shows a timing chart of the signals in the TTZ signal generating circuit.

FIG. 13 shows a timing chart of the signals in the TTZ signal generating circuit. The timers A 112, B 113 and C 114 in the timer 111 counts down from their set value to output the underflow signals, as shown in FIG. 12. The timers A 112, B 113 and C 114 output the signal TS1, TS2 and TS3, respectively, and send them to the exchanging circuit 110. When the signal ENABLE is "H", the exchanging circuit 110 generates a signal TS12 by calculating the EXCLUSIVE OR of the signals TS1 and TS2. Then, the circuit 110 generates the signal TTZ to supply to the A/D converter, by calculating the EXCLUSIVE OR of the signal TS12 and the signal TS3. As a result, the period of the signal TTZ is not constant but depends on each pulse, as shown in FIG. 13. The first, third and fourth pulses have a period T, and the second pulse has a period 2T.

The signal TTZ is supplied to the A/D control signal generating block B 14 in the A/D converter. The A/D control signal generating block B 14 generates the control signal TZ2 for controlling the successive approximation register 3 as well as the signals to control the turning on and off of the semiconductor switches 9–11, which are shown in FIG. 10. The signal TZ2 may be identical with the signal TTZ received from the TTA signal generating circuit.

As explained, the second embodiment is characterized by the use of an external circuit, for example, a timer 111, for changing the period of the control signal TZ2 to the successive approximation register 3. When set values in the timer 111 are set using a computer program, the periods of the control signal can be arbitrarily set or changed.

In this example, the period of the signal TZ2 at the section T2 is equal to the corresponding period in the conventional method, and the periods at the time section T1, T3, T4 are a half of the corresponding time section of the conventional method.

By the way, there are many variations in the external circuit. In this example of the second embodiment, a plurality of timers are used, however the same function and effects can be obtained using one so-called reload register. The exchanging circuit is not an inevitable element for the external circuit. The external circuit can be constructed also using a PWM (pulse width modulator) to obtain the identical effects.

As explained, in the second embodiment, the period at each comparing section T1–T4 is changed using an external clock, for example, external timers. The period of pulse is reduced at the sections T1, T3, T4, and the period of clock at the section T2, is longer than that at the other sections, as is the case of the first embodiment. This is because the time section T2 requires a longer time for stabilizing the reference voltage due to a rather larger difference voltage between the former and present reference voltages. Thus the sharing of the comparing times can be optimized. And a speeding up of the A/D conversion is attained.

The time for A/D conversion can be expressed by the following expression:

Conversion Time=Section T1+Section T2+Section T3+Section T4

In the conventional method,

> Section T1=Section T2=Section T3=Section T4=T
>
> Conversion time=4T

According to the second embodiment,

> Section T1=Section T3=Section T4=T/2
>
> Section T2=T
>
> Conversion time is=T+3(T/2)=(5/2)T Consequently, in the second embodiment, the reduction ratio of time for A/D conversion compared to the conventional method is 37.5%.

Embodiment 3

In the first and second embodiments, the period of the control signal of the successive approximation register 3 is changeable. The object of the invention can be attained also by changing the duty ratio of the control signal.

Figure 14:
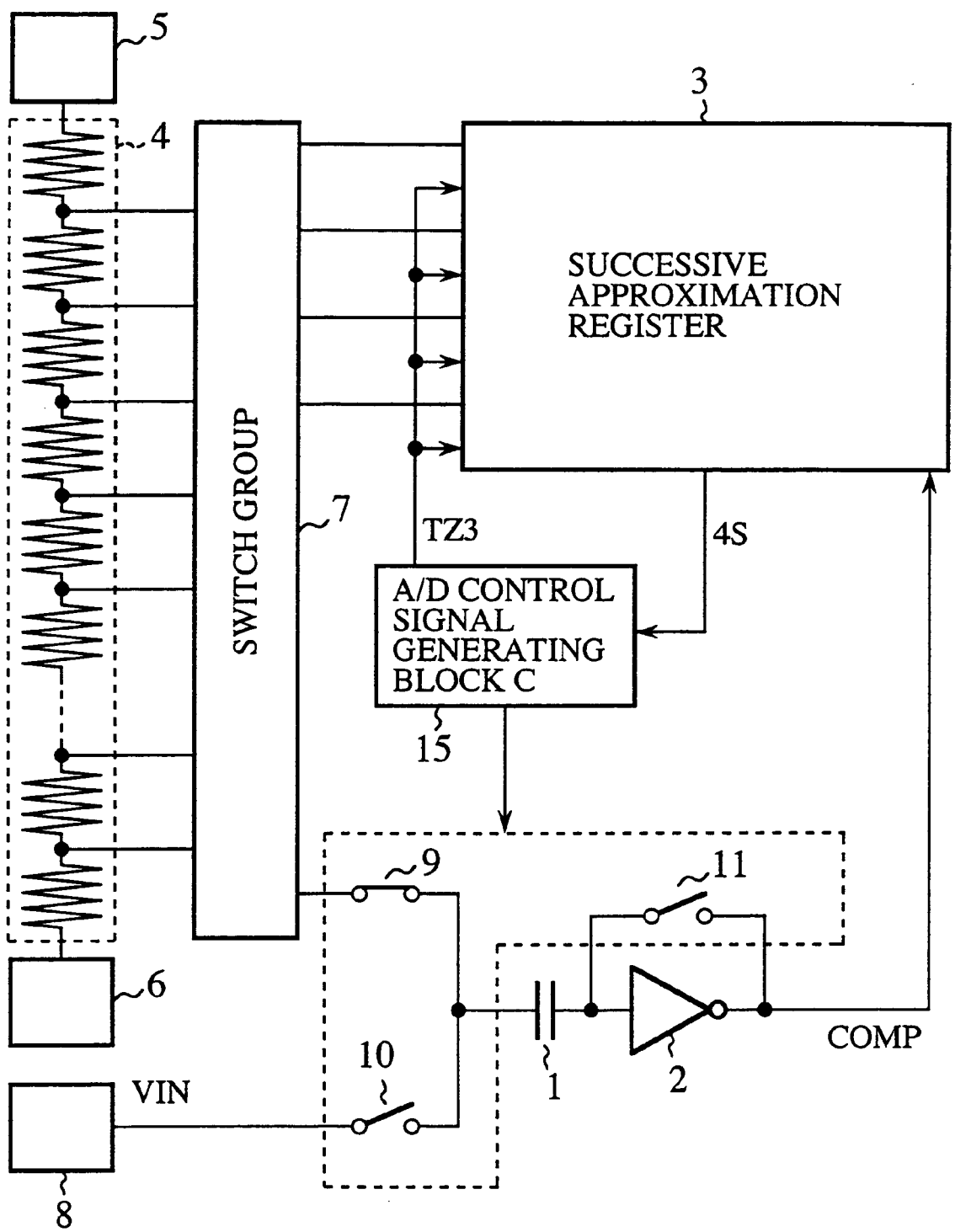
FIG. 14 shows a block diagram of an A/D converter, in which the method for controlling a successive approximation type A/D converter according to the third embodiment of the present invention is applied.

FIG. 14 shows a block diagram of an A/D converter, in which the method for controlling a successive approximation type A/D converter according to the third embodiment of the present invention is applied. The elements in FIG. 14, which are identical or equivalent with elements in FIG. 1 are referred by the same reference numerals, and their explanation is omitted.

An A/D control signal generating block C 15 generates control signals for turning on or turning off the semiconductor switch 9, 10, and 11, as well as a control signal (hereinafter called a signal TZ3) for determining the timing of delivery of data from the successive approximation register 3 to the switch group 7. The A/D control signal generating block C 15 in this example generates the timing signal and the control signal TZ3, according to the signal 4S, which is supplied from the successive approximation register 3.

The function of the A/D converter is explained below.

Figure 15:
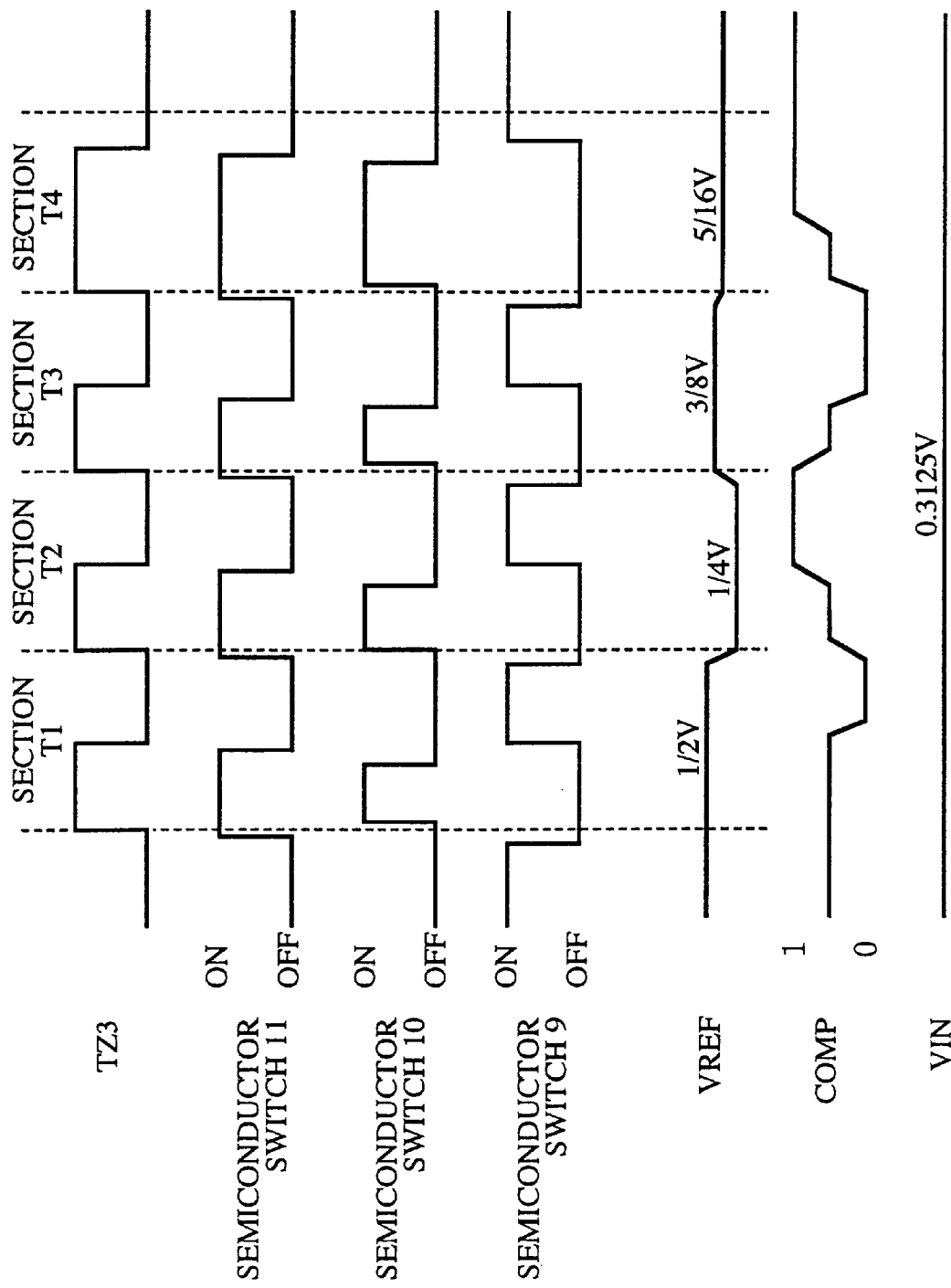
FIG. 15 shows a timing chart of the signals in the successive approximation type A/D converter according to the third embodiment of the present invention.

FIG. 15 shows a timing chart of the signals in the A/D converter according to the third embodiment of the present invention, shown in FIG. 14. Its substantial function is identical with that of the first embodiment. An input voltage VIN of 0.3125 volts is inputted from the input terminal 8, and is converted to a 4 bit digital signal. The period of the control signal TZ3 is a half of the period of the signal TZ of the conventional method.

The function of the A/D control signal generating block C 15 is explained below.

Figure 16:
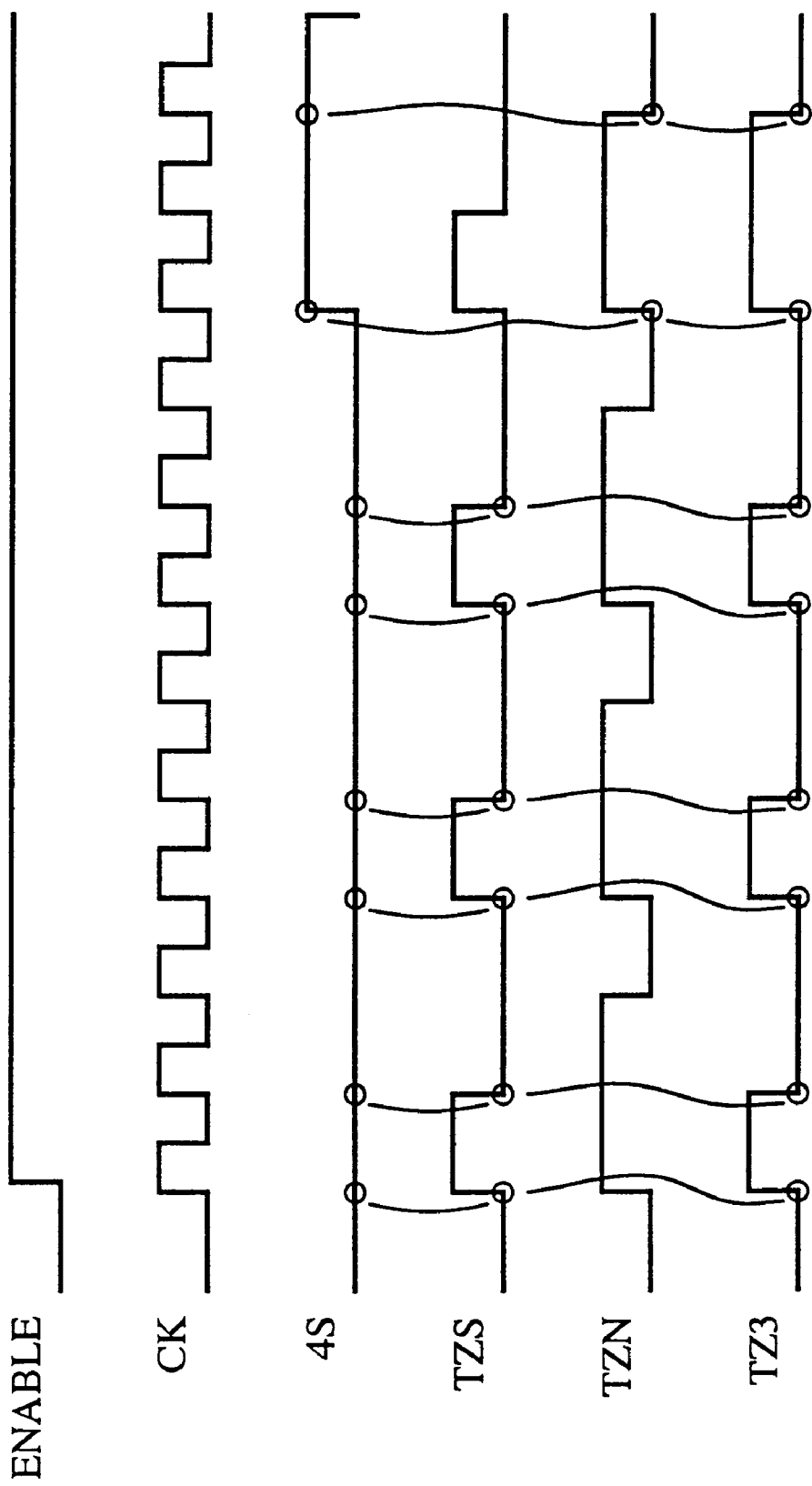
FIG. 16 shows a timing chart of signals in the A/D control signal generating block C.
Figure 17:
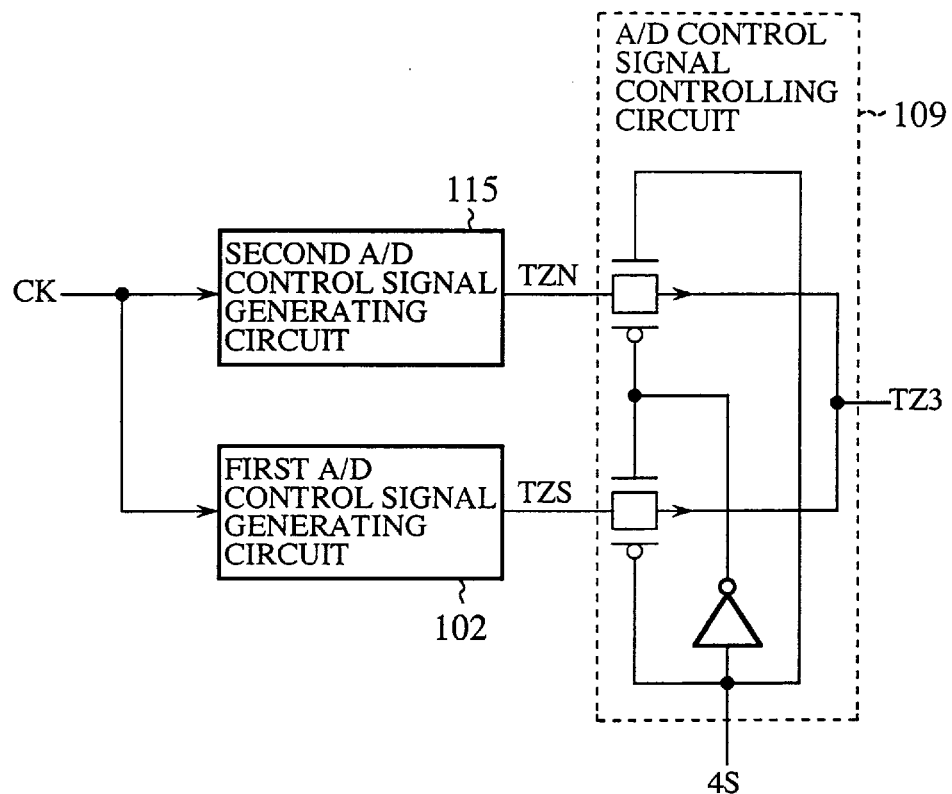
FIG. 17 shows an electric circuit of the first A/D control signal generating block C.

FIG. 16 shows a timing chart of signals in the A/D control signal generating block C 15. FIG. 17 shows an example of the circuit of an A/D control signal generating block C 15. The A/D control signal generating block C 15 is comprised of a first A/D control signal generating circuit 102, a second A/D control signal generating circuit 115 and an A/D control signal controlling circuit 109, as shown in FIG. 17.

The output of the first A/D control signal generating circuit 102 is the signal TZS, and the output the second A/D control signal generating circuit 115 is the signal TZN. According to the output of the shift registers in the successive approximation register 3, for example 4S, the A/D control signal controlling circuit 109 selects a signal from the signals TZS and TZN, and sends it to the successive approximation register 3 as a control signal TZ3.

As shown in FIG. 16, when the output 4S is "L", the signal TZS with small pulse width from the first A/D control signal generating circuit 102 is selected, and it is outputted as signal TZS. On the other hand, when the output 4S is "H", the signal TZN with long pulse width from the second A/D control signal generating circuit 115 is selected, and it is outputted as control signal TZS. As a result, the duty ratio of the signal TZ3 is changed. As shown in FIG. 15, at the time section T4, where the output 4S is "H", the pulse width of the signal TZN is made longer. Thus, the sharing of time for data comparison is optimized.

Figure 18:
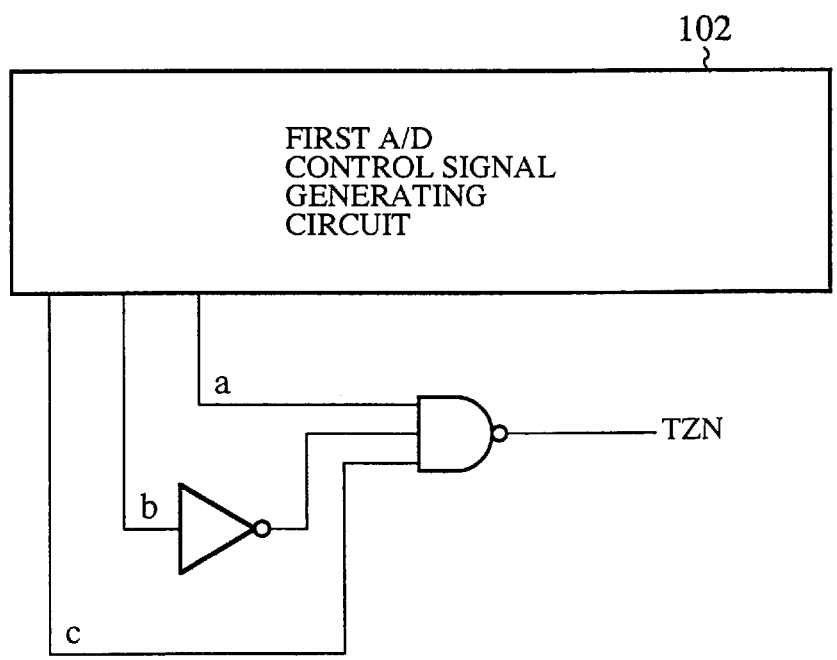
FIG. 18 shows an electric circuit of the second A/D control signal generating block C.
Figure 19:
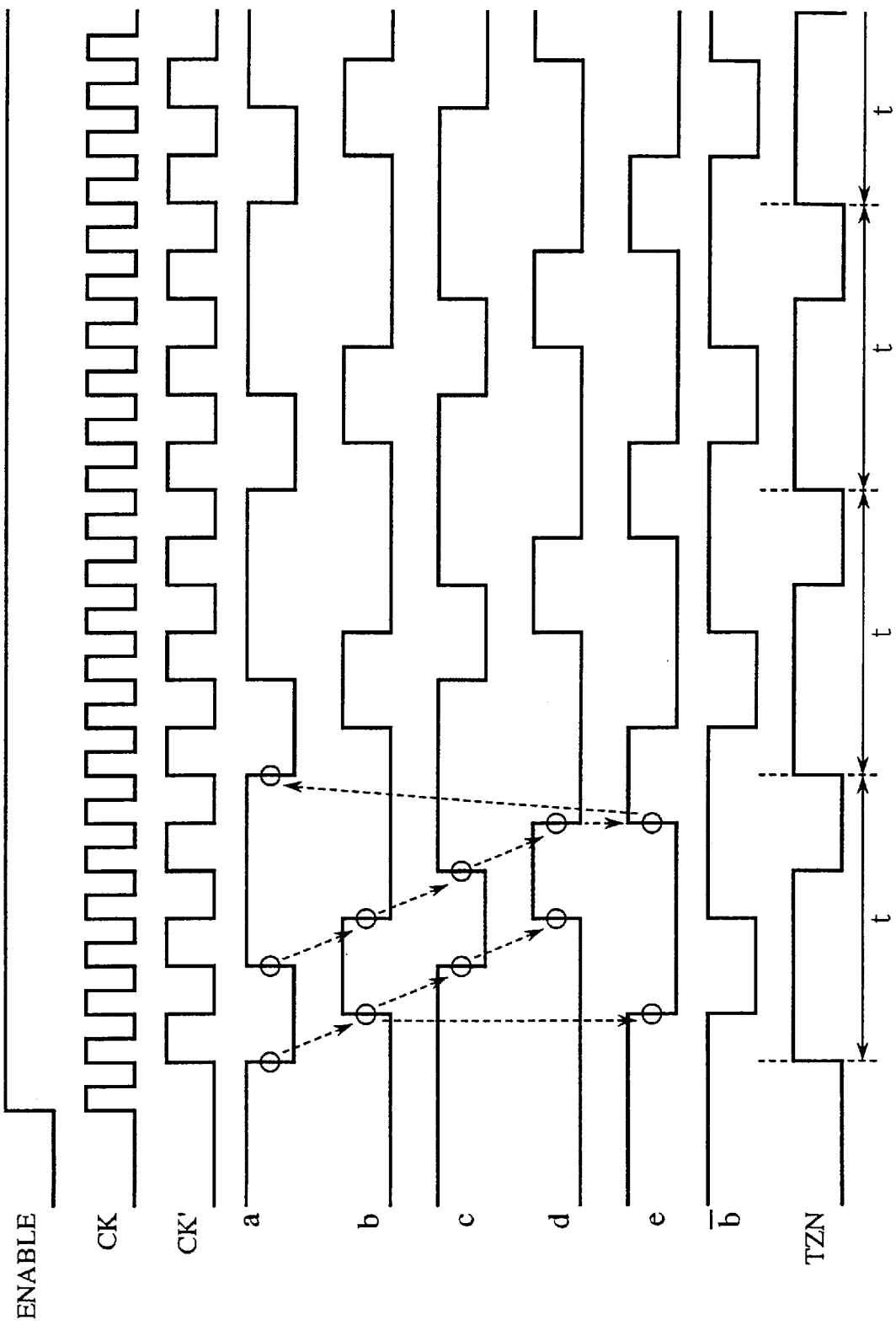
FIG. 19 shows a timing chart of signals in the circuit of the second A/D control signal generating block.

FIG. 18 shows an example of the block diagram of the second A/D control signal generating circuit 116 in the A/D control signal generating block C 15. FIG. 19 shows a timing chart of the signals in the second A/D control signal generating circuit 115. The detail of the block 102 in the FIG. 18 is shown in FIG. 33. The second A/D control signal generating circuit 115 calculates the NAND of the signal at points a, the inverse of the signal at point b and the signal at the point c of the A/D control signal generating circuit 102 shown in FIG. 33, to generate the signal TZN.

As explained, in the third embodiment, the period at each comparing section T1–T4 is changed using an external clock, for example, timers. The period of clock is reduced at the section T1, T3, T4, and the period of clock at the section T2 which requires a longer time for stabilizing the reference voltage due to a rather larger difference voltage between the former and present reference voltages, is longer than that at the other sections, as is the case of the first embodiment.

As explained, the A/D converter according to the third embodiment of the present invention, the period of the control signal (signal TZ3) is set to be a half of the signal TZ of the conventional method. And the duty ratio of the control signal is changed so that the time of "H" is elongated only at the comparison section T4. This section requires a longer time, due to the smallness of the difference between the input voltage and the reference voltage. The sharing of time for comparison is optimized also in this embodiment and the A/D conversion is carried out more quickly.

The time for A/D conversion can be expressed by the following expression:

> Conversion Time=Section T1+Section T2+Section T3+Section T4

In the conventional method,

> Conversion time=4T

According to the third embodiment,

> Conversion time is=4(T/2)=2T

Consequently, in the third embodiment, the reduction ratio of time for A/D conversion compared to the conventional method is 50.0%.

Embodiment 4

In the first embodiment, the change of the period of the control signal is carried out, by selecting a signal from the signals C and TZS as control signal. In the second embodiment, an external signal is used for changing the period of the control signal. The period can be changed by using a software program.

Figure 20:
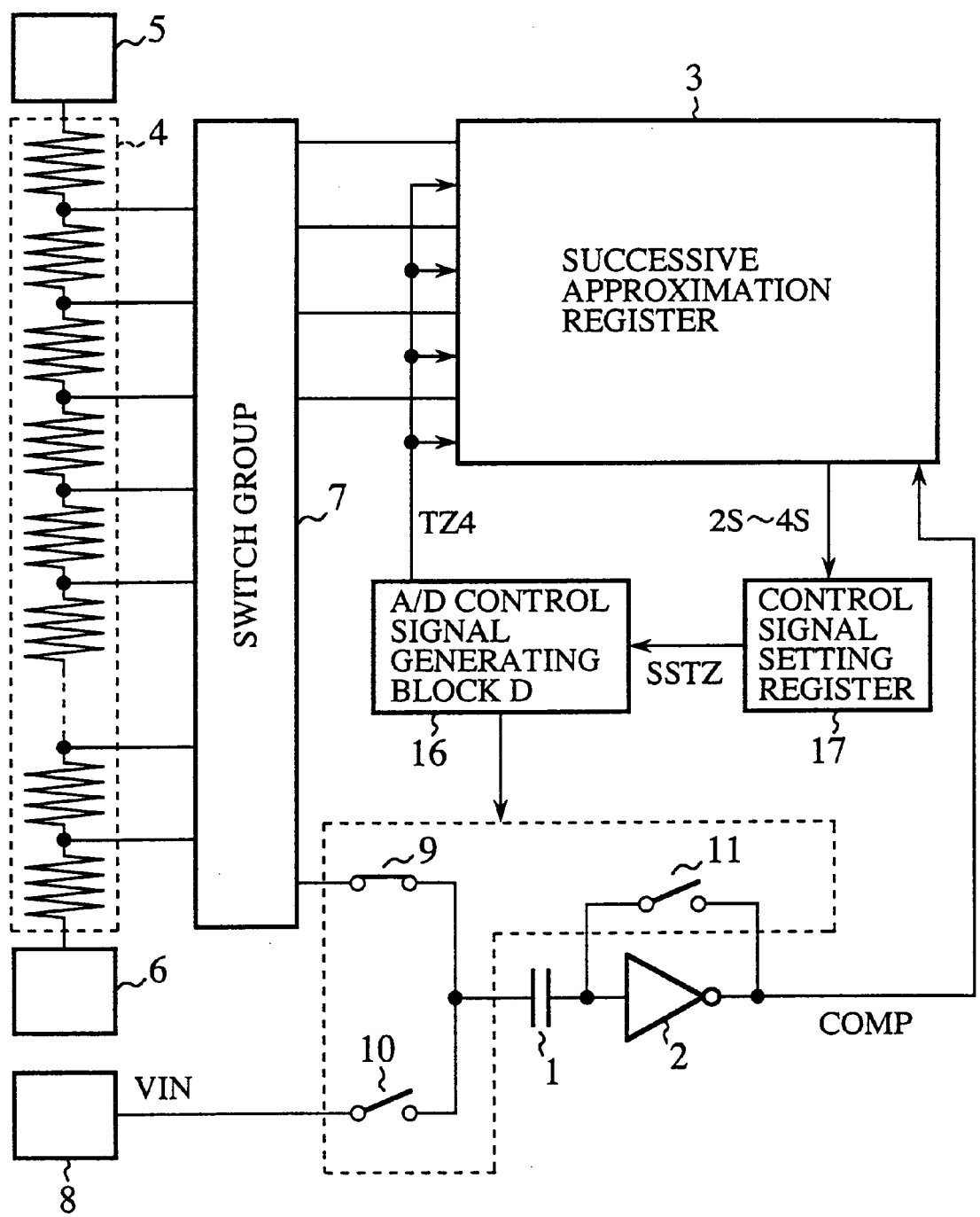
FIG. 20 shows a block diagram of an A/D converter applied the method according to the fourth embodiment of the present invention.

FIG. 20 shows a block diagram of an A/D converter applied the method according to the fourth embodiment of the present invention. The elements in FIG. 20, which is identical or equivalent with elements in FIG. 1 are referred by the same reference numerals. Thus their explanation is omitted.

An A/D control signal generating block D 16 generates control signals for turning on or turning off the semiconductor switch 9, 10, and 11, as well as a control signal (hereinafter called a signal TZ4) for determining the timing of delivery of data from the successive approximation register 3 to the switch group 7. Reference numeral 17 denotes a control signal setting register, which generates a signal SSTZ for generating a desired control signal (hereinafter called TZ4), corresponding to data set therein by a computer software.

Figure 21:
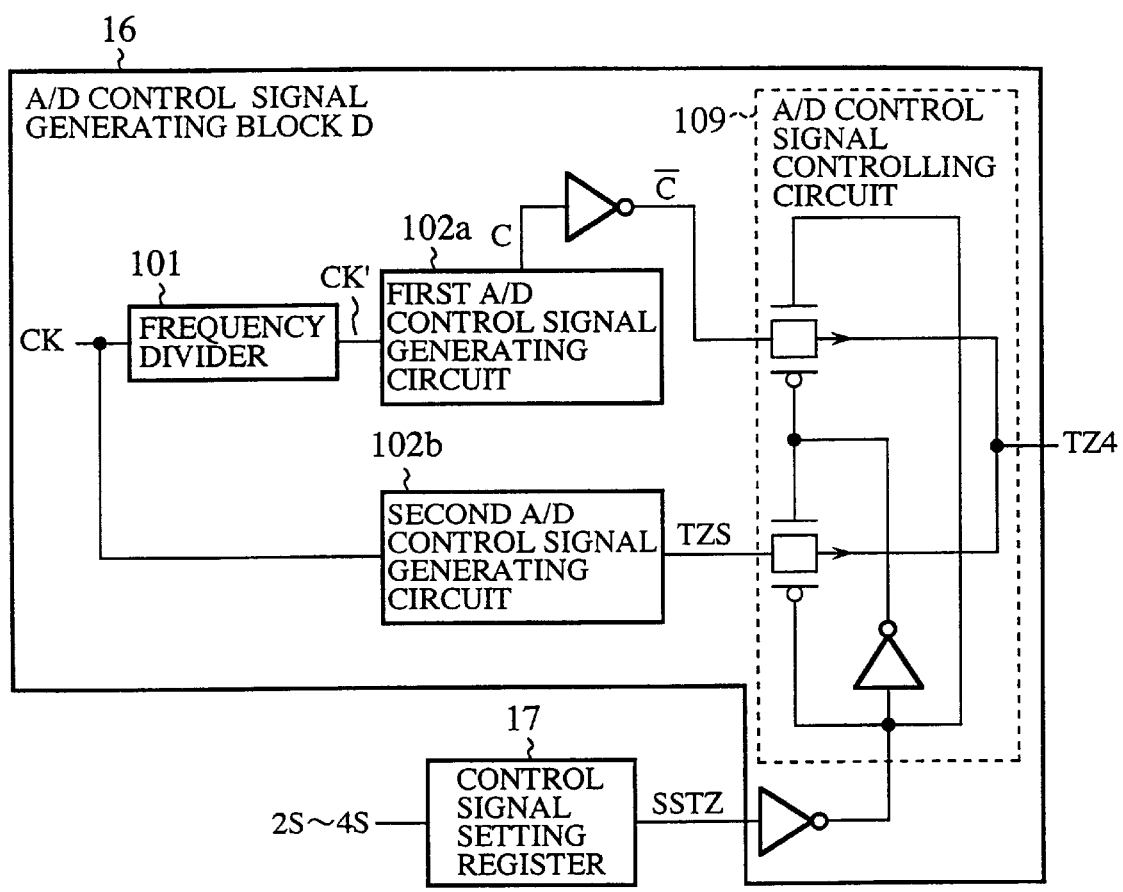
FIG. 21 shows a block diagram of an A/D converter applied the method according to the fourth embodiment of the present invention.
Figure 22:
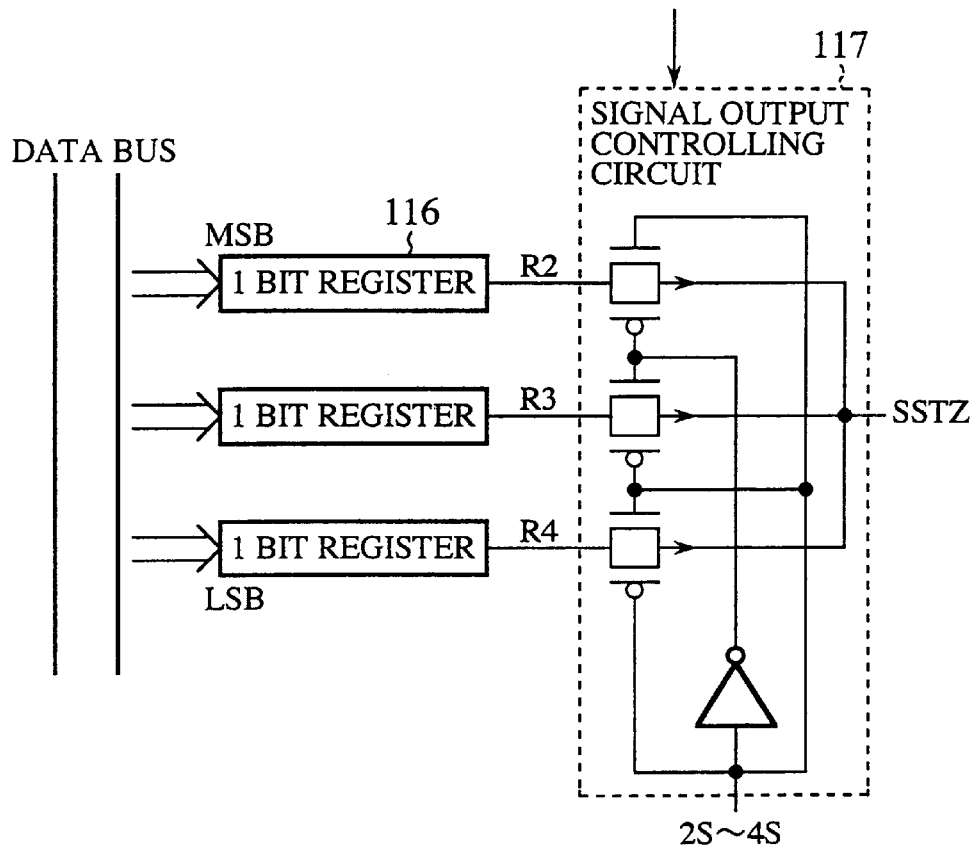
FIG. 22 shows a block diagram of the control signal setting register in the fourth embodiment.

FIG. 21 shows a block diagram of the A/D control signal generating block D 16. FIG. 22 shows a block diagram of the control signal setting register 17. The A/D control signal generating block D 16 is comprised of a frequency divider 101, a first and second A/D control signal generating circuit 102a, 102b, and an A/D control signal controlling circuit 109, similar to the A/D control signal generating block A 13 of the first embodiment of the present invention. The control signal setting register 17 is comprised of three one bit registers 116 and a signal outputting control circuit 117, as shown in FIG. 22.

The function of the A/D converter according to the fourth embodiment is explained below.

Figure 24:
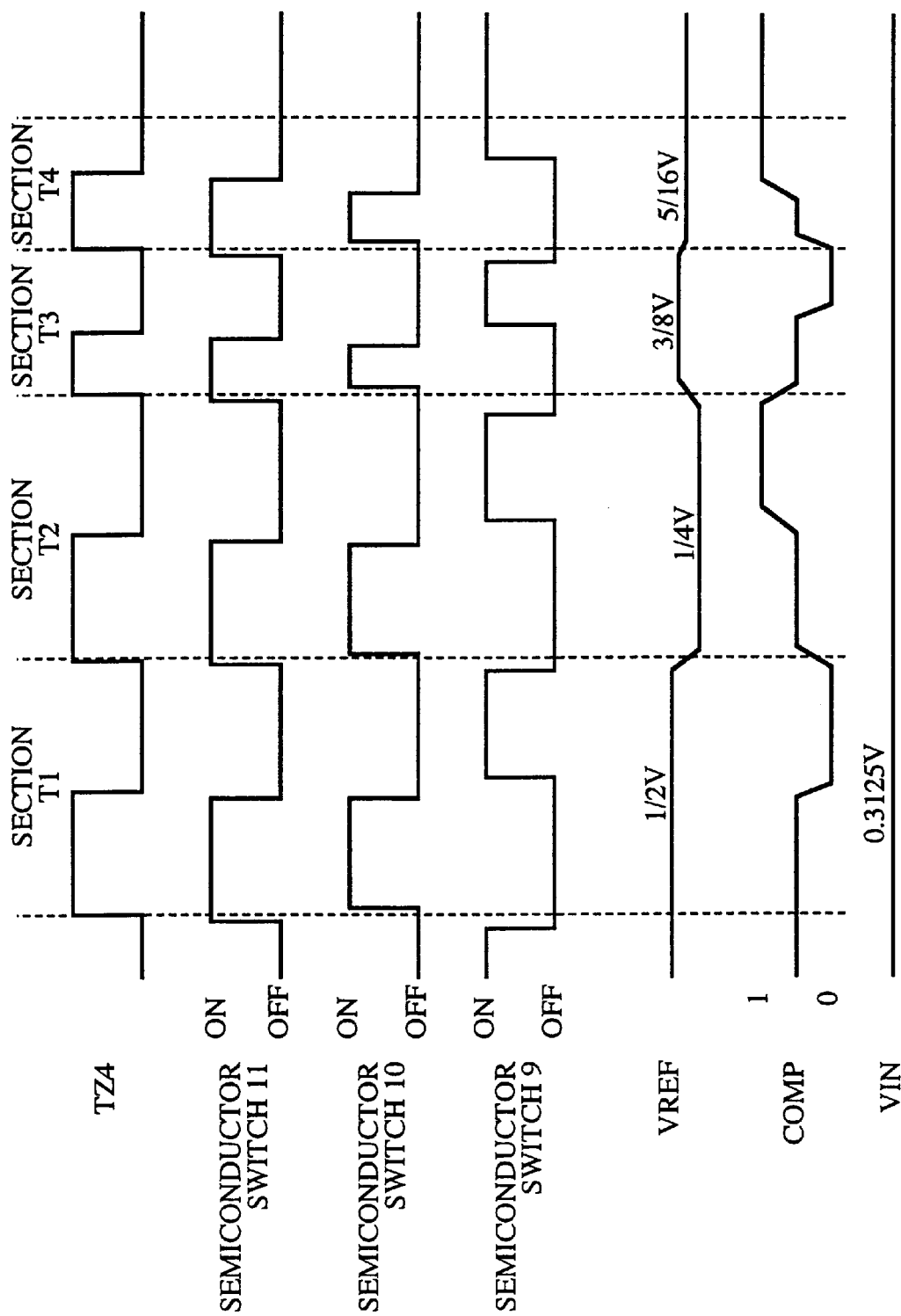
FIG. 24 shows a timing chart of signals in the successive approximation type A/D converter according to the fourth embodiment.

FIG. 24 shows a timing chart of signals in the A/D converter according to the fourth embodiment shown in FIG. 20. Its substantial function is identical to that of the first embodiment. The input voltage VIN of 0.3125 volts inputted from the input terminal 8 is converted to a 4 bits digital signal. In this example, the periods of the control signal (signal TZ4) in the comparing sections T3 and T4 are changed to a half compared with the conventional period.

The A/D control signal generating block D 16 in FIG. 21 comprises a frequency divider 101 for generating a signal CK' by frequency dividing the input clock signal CK, a first A/D control signal generating circuit 102a for generating a signal C from the signal CK', a second A/D control signal generating circuit 102b for generating a signal TZS directly from the signal CK, and an A/D control signal controlling circuit 109 for selecting one of the signals C and TZS according to a signal SSTZ to output the signal TZ4, which controls the successive approximation register 3. The signal SSTZ is supplied from the control signal setting register 17. The control signal setting register generates the signal SSTZ, on the basis of a set value in the one bit register 116 for each bit as well as the value of the signals S1–S4 supplied from the successive approximation register 3, as shown in FIG. 22. The data in the one bit register 116 are provided by a software program through a data bus.

Figure 25:
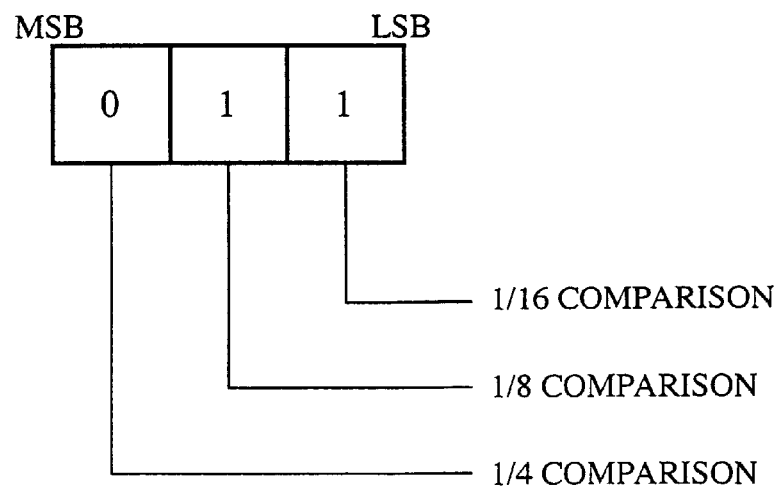
FIG. 25 shows an example of data set in the one bit registers in the fourth embodiment.
Figure 23:
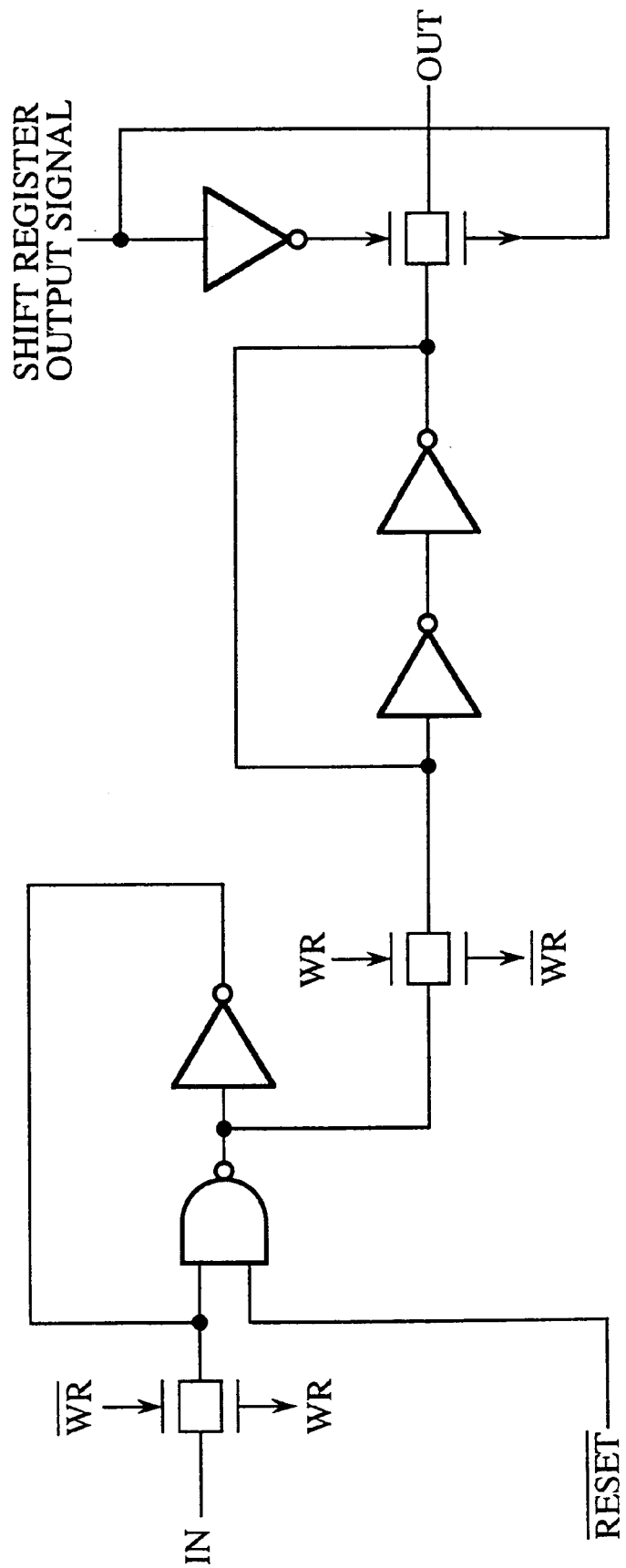
FIG. 23 shows an electric circuit of one bit registers in the control signal setting register.

As shown in FIG. 22, a set of data is provided into a set of one bit registers 116 of the control signal setting register 17 from a software program through a data bus. FIG. 25 shows an example of data set in the one bit registers 116 provided by a software program. Arbitrarily the period of any comparing section can be elongated, by setting the corresponding register to "H" by a software program. Thus the period of the control signal TZ4, which controls the successive approximation register 3 in the corresponding time section can be controlled.

FIG. 26 shows a timing chart of signals in the control signal setting register 17, in which a set of data is given by a software program. When some data R2–R4 in the one bit register 116 are "H", and the corresponding outputs 2S, 3S or 4S of the shift register A 106 in the successive approximation register 3 are "H" simultaneously, the output SSTZ of the control signal setting register 17 becomes "H".

Figure 27:
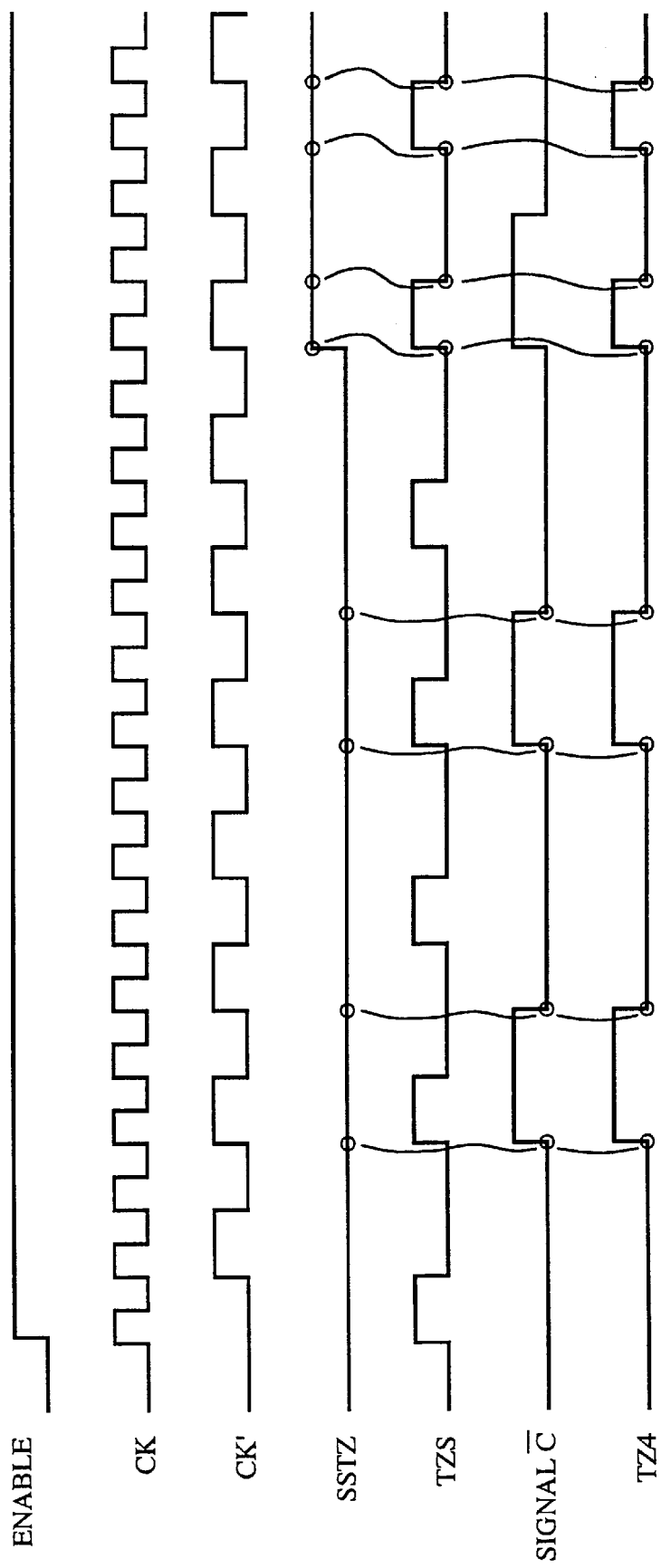
FIG. 27 shows a timing chart of the signals in the A/D control signal generating block D in the fourth embodiment.

FIG. 27 shows a timing chart of the signals in the A/D control signal generating block D 16 for generating the control signal TZ4 to the successive approximation register 3. When the signal SSTZ from the control signal setting register 17 is "L", the A/D control signal controlling circuit 109 in the block 16 selects the signal TZS, which is generated by the second A/D control signal generating circuit 102b directly from the signal CK. When the signal SSTZ is "H", the A/D control signal controlling circuit 109 selects the signal C, which is generated by the first A/D control signal generating circuit 102a from the signal CK' obtained by the frequency divider 101. The A/D control signal generating block D 16 outputs the signal, selected by the A/D control signal controlling circuit 109, as a control signal for the corresponding comparing section to the successive approximation register 3.

As shown in the timing chart in FIG. 24, when the signal TZ4 is used as a control signal, the periods of the control signal at the comparing sections T3 and T4 in the A/D conversion are changed to a half of the conventional one, and the periods of the control signal at the comparing sections T1 and T2 are unchanged. In this example, the periods of the control signal are changed only at the comparing sections T3 and T4. However, the present invention is not limited to this example. The important feature of this embodiment is that the periods of the control signal at any arbitrary comparing section can be changed by a software program, to optimize the sharing of time for the data comparison so as to reduce the conversion time.

As explained, in the fourth embodiment, the period of control signal at any arbitrary comparing section T1–T4 can be changed using a software program. For example, the periods of the control signal in the sections T3 and T4 are reduced. On the other hand, the period of control signal at the sections T1 and T2 which require a longer time for stabilizing the reference voltage due to a rather larger difference voltage between the former and present reference voltages, are made longer than that at the other sections. Thus it is possible to optimize the sharing of the comparison time so as to speed up the A/D conversion.

The time for A/D conversion can be expressed by the following expression:

Conversion Time=Section T1+Section T2+Section T3+Section T4

In the conventional method,

Conversion time=4T

According to the fourth embodiment,

Conversion time is=2T+2(T/2)=3T

Consequently, in the fourth embodiment, the reduction ratio of time for A/D conversion compared to the conventional method is 25.0%.

Embodiment 5

In the fourth embodiment, the periods of control signal at any arbitrary comparison section in the successive approximation register 3 are changed by a software program. This idea can be applied to change the duty ratio of the control signal.

Figure 28:
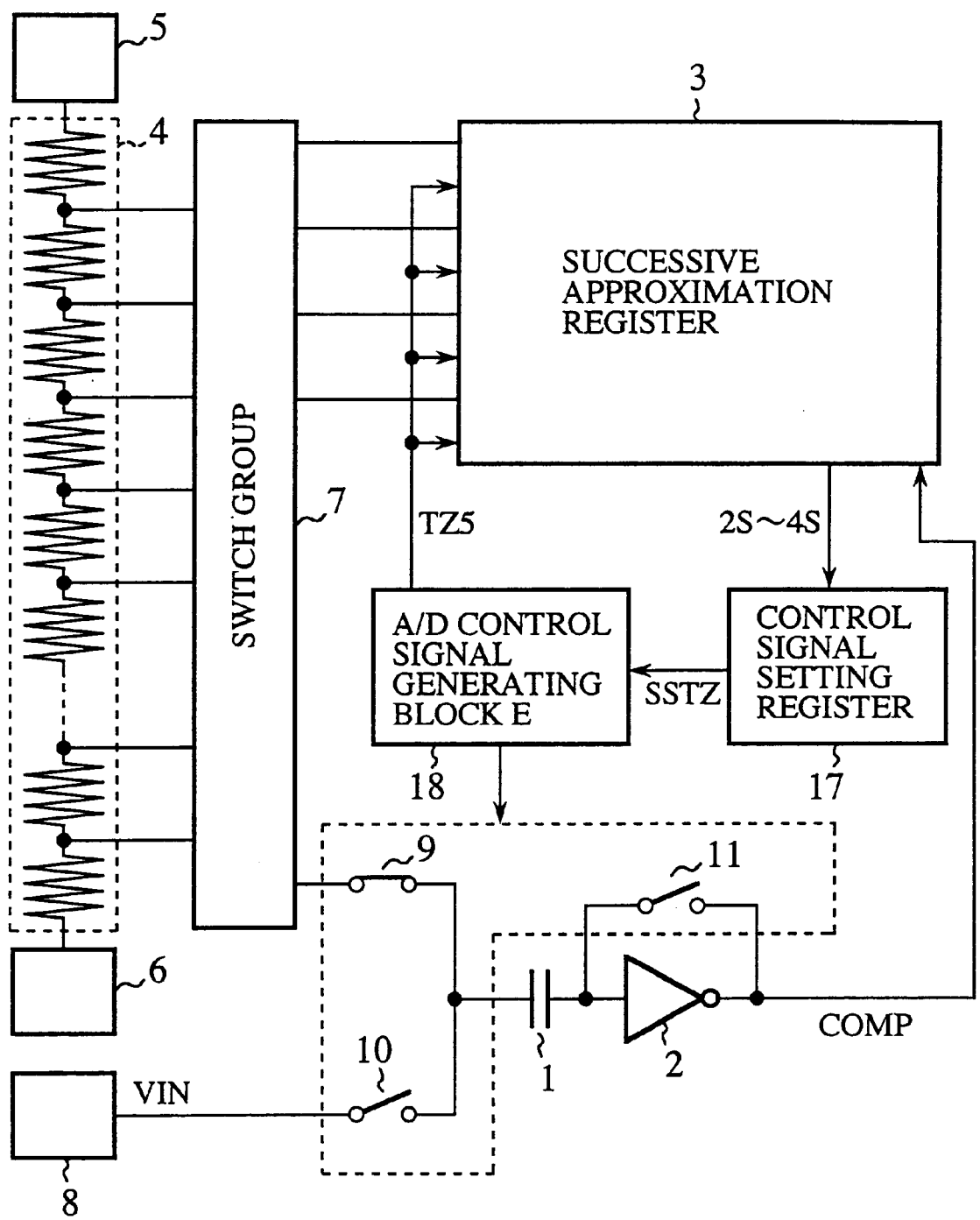
FIG. 28 shows a block diagram of an A/D converter applied the method according to the fifth embodiment of the present invention.

FIG. 28 shows a block diagram of an A/D converter applied the method according to the fifth embodiment of the present invention. The elements in FIG. 28, which is identical or equivalent with elements in FIG. 20 are referred by the same reference numerals. Thus their explanation is omitted.

An A/D control signal generating block E 18 generates control signals for turning on or turning off the semiconductor switch 9, 10, and 11, as well as a control signal (hereinafter called a signal TZ5) for determining the timing of delivery of data from the successive approximation register 3 to the switch group 7. The A/D control signal generating block C 15 generates the timing signal and the control signal TZ5 from the signal SSTZ, which is supplied from a control signal setting register 17, the value in the register 17 is determined by a software program.

Figure 29:
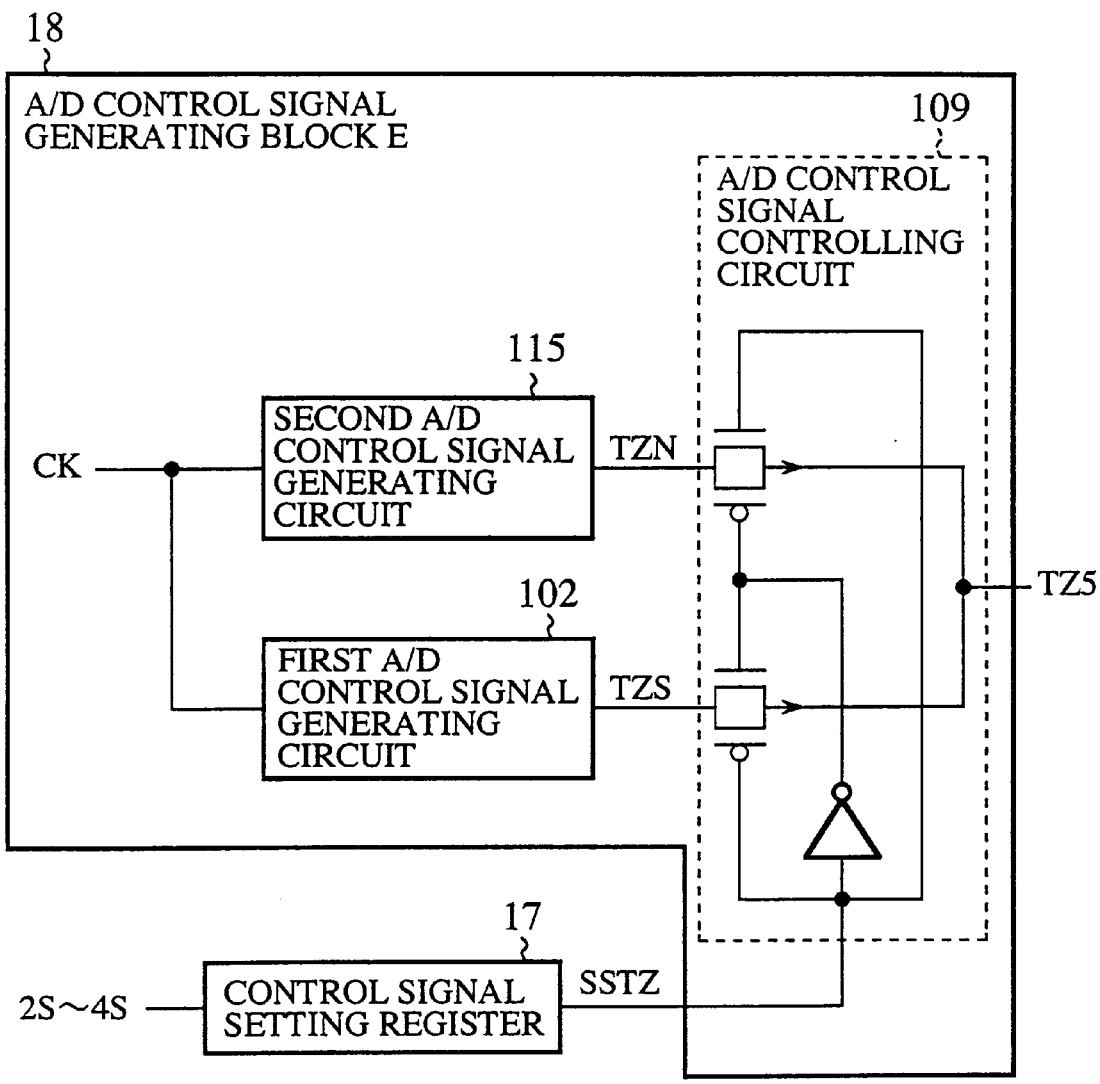
FIG. 29 shows a block diagram of the A/D control signal generating block D in the fifth embodiment.

FIG. 29 shows a block diagram of the A/D control signal generating block E 18. The A/D control signal generating block E 18 is comprised of a first A/D control signal generating circuit 102, a second A/D control signal generating circuit 115 and an A/D control signal controlling circuit 109, similar to the A/D control signal generating block C 15 of the third embodiment shown in FIG. 17.

The function of the A/D control signal generating block E 18 is explained below.

Figure 30:
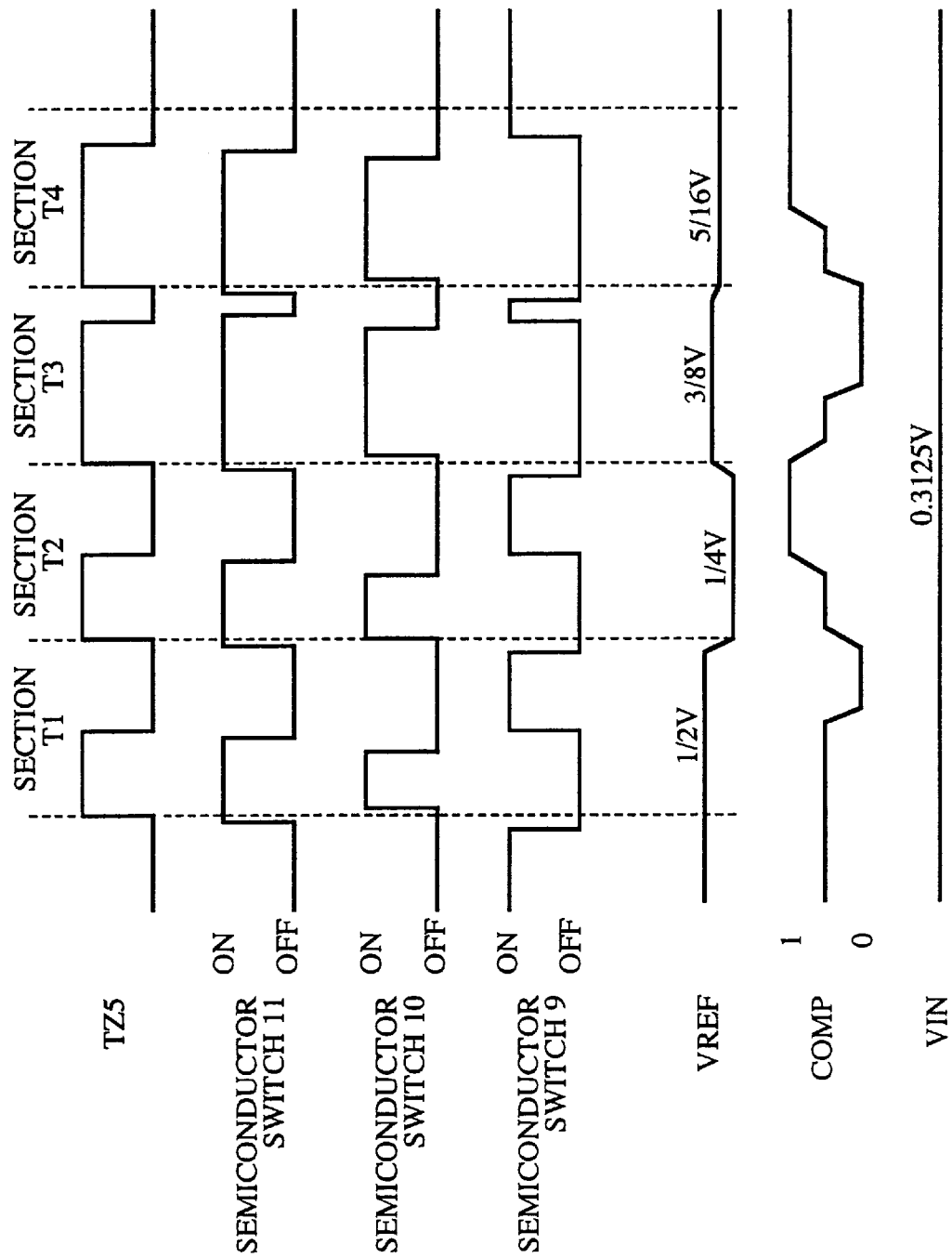
FIG. 30 shows a timing chart of the signals in the A/D converter according to the fifth embodiment of the present invention.

FIG. 30 shows a timing chart of the signals in the A/D converter shown in FIG. 28, according to the fifth embodiment of the present invention. Its substantial function is identical with that of the third embodiment. An input voltage VIN of 0.3125 volts is inputted from the input terminal 8, and is converted to a 4 bit digital signal. This is an example that the periods of "H" state at the comparison section T3 and T4 are elongated, by changing the duty ratio of the control signal TZ5.

The first A/D control signal generating circuit 102 generates the signal TZS from the signal CK. The second A/D control signal generating circuit 115 generates the signal TZN from the signal CK. The control signal setting register 17 generates the signal SSTZ, on the basis of the values set by a software program as well as a set of the outputs 2S–4S of the successive approximation register 3. The A/D control signal generating block E 18 in FIG. 29 generates a signal TZ5 and sends it to the successive approximation register 3, by selecting a signal from the signal TZS and the signal TZN according to the signal SSTZ from the control signal setting register 17.

The values in the one bit register 116 of the control signal setting register 17 are set by a software program through a data bus. The elongation of the duty ratio in any arbitrary comparison section can be attained, by setting the corresponding one bit register in the control signal setting register 17 to "H", using a software program. By this setting, the width of "H" state of the signal TZ5 in the corresponding time section, which is a control signal of the successive approximation register, is elongated. The generation of the signal SSTZ is identical as in the fourth embodiment, and its explanation is omitted.

Figure 31:
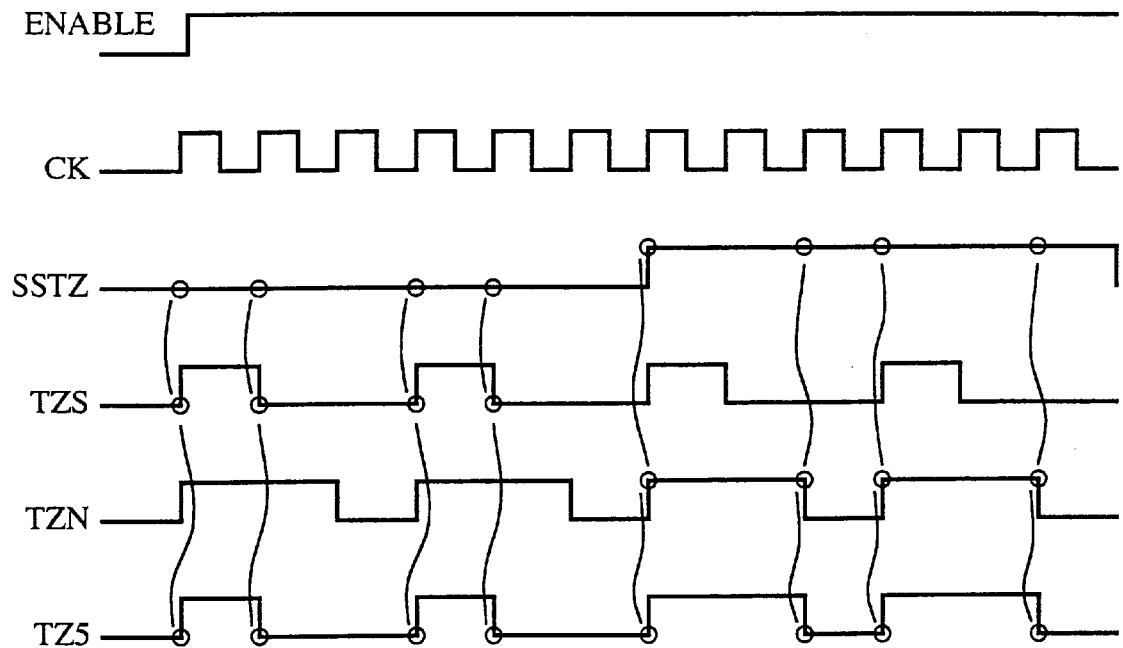
FIG. 31 shows a timing chart of signals in the A/D control signal generating block D in the fifth embodiment.

FIG. 31 shows a timing chart of signals in the A/D control signal generating block E 18 for generating the signal TZ5, which shall be sent to the successive approximation register 3, on the basis of the signal SSTZ. When the signal SSTZ is "L", the A/D control signal controlling circuit 109 selects the signal TZN generated by the first A/D control signal generating circuit 102, on the other hand, when the signal SSTZ is "H", the signal TZN generated by the second A/D generating circuit beta 115 is selected. And the A/D control signal generating block E 18 outputs the selected signal as a control signal of the corresponding comparison section to the successive approximation register 3.

When this signal TZ5 is used as a control signal for the A/D conversion, the widths of "H" state at the comparison sections T3, T4 are elongated, as shown in FIG. 30, so as to optimize the sharing of comparison time. In this example, the widths of "H" state only in the section T3, T4 are elongated. However, the present invention is not limited to this example. The important feature of the fifth embodiment is that the width of "H" state at any arbitrary comparison section can be changed by a software program, so as to reduce the A/D conversion time.

As explained, the duty ratio of the control signals at some comparison sections T1–T4 can be changed by a software program in the fifth embodiment. When the period of the control signal (signal TZ5) is set to a half of the conventional one, and the width of "H" state of the control signal is made longer at some comparison sections, the sharing of comparison time can be optimized and the speed up of the A/D conversion is made possible. For example, the duty ratio only in the sections T3 and T4, which requires a longer time due the smallness of the difference between the input voltage and the reference voltage, can be changed to elongate the period of "H" state.

The time for A/D conversion can be expressed by the following expression:

Conversion Time=Section T1+Section T2+Section T3+Section T4

In the conventional method,

Conversion time=4T

According to the fifth embodiment,

Conversion time is=4(T/2)=2T

Consequently, in the fourth embodiment, the reduction ratio of time for A/D conversion compared to the conventional method is 50.0%.

According to the present invention, the period of the control signal can be changed for each comparison section, and the reference voltage and the input voltage are compared under the control of the period changed control signal. Thus it is possible to optimize the sharing of the time for the comparison; the period of the sections other than the section T2 can be shortened. And the period in the section T2 is made relatively larger. Because the section T2 requires a longer comparison time for the stabilization of the reference voltage due the larger difference between the former reference voltage and the present reference voltage. As a result, a method for controlling an A/D converter, which makes possible to speed up the A/D conversion is attained.

In an embodiment, the clock signal is frequency divided to obtain a plurality of timing signals having different frequency division ratios. One of them is selected as a control signal for each comparison section. Thus the period of the control signal can be changed for each comparison section. It is possible to optimize the sharing of comparison time; the period of control signal other than a comparison section, which requires a longer stabilization time due to a large difference between the former reference voltage and the present reference voltage, can be shortened. The speed up of the A/D conversion is possible.

In an embodiment, the period of the control signal is changed for each comparison section, by using a control signal generated, based on an external signal. And the period of the control signal can be changed by, for example, by changing the set value of a timer circuit, which is an example of the external circuit. It is possible to optimize the sharing of the comparison time; the period of the control signal at the sections other than a comparison section which requires a longer comparison time due to a larger difference between the former reference voltage and the present reference voltage, can be shortened. The speed up of the A/D conversion is possible.

In an embodiment, the period of the control signal is controlled by data set by a software program, thus the period of the control signal can be changed for each comparison section, by the software program. It is possible to optimize the sharing of comparison time; the period of control signal at the time sections other than a time section which requires a longer comparison time for stabilization of the reference voltage due to larger difference between the former reference voltage and the present reference voltage, can be shortened. The speeding up of A/D conversion is possible.

In an embodiment, the duty ratio of the control signal is changeable for each comparison section, the comparison between the reference voltage and the input voltage is carried out under the control of the duty ratio changed control signal. It is possible to shorten the "H" time at the comparison section other than a comparison section which requires a longer comparison time due to the smallness between the input voltage and the reference voltage. Thus it is possible to optimize the sharing of comparison time. And a method for controlling an A/D converter, which makes possible to speed up the A/D conversion is attained.

In an embodiment, the duty ratio of the control signal is changed under the control of data set by a software program. The duty ratio of the control signal can be changed for each comparison section; the duty ratio of the control signal at the comparison section other than a comparison section which requires a longer comparison time due to small difference between the input voltage and the reference voltage, can be changed so that the "H" time is made longer. It is possible to optimize the sharing of comparison time, and to speed up the A/D conversion.

What is claimed is:

1. A method for controlling an analog/digital converter, in which a reference voltage for each bit is successively generated depending on control signals from the highest bit, and is compared with an input voltage to obtain a corresponding bit digital value, wherein a period or duty ratio of said control signals is changeable for each comparison section, in which the corresponding reference voltage is compared with the input voltage, and the comparison between the reference voltage and the input voltage for identifying the digital value of the corresponding bit is carried out under the control of the changed control signal.

2. A method for controlling an analog/digital converter according to claim 1, wherein a clock signal is frequency divided to generate a plurality of timing signals having different periods; and the period of the control signal is changed by selecting one of the timing signals for each comparison section.

3. A method for controlling an analog/digital converter according to claim 1, wherein an external signal for each comparison procedure is generated outside the analog/digital converter; and the period of the control signal is changed by using the external signal as the control signal.

4. A method for controlling an analog/digital converter according to claim 1, wherein a clock signal is frequency divided by a plurality of frequency dividers to generate a plurality of timing signals having different periods; a software program sets a value in a register for each comparison section; and the period of the control signal is changed by selecting one of the timing signals for each comparison section, according to the set value in the register.

5. A method for controlling an analog/digital converter according to claim 1, wherein a set of signals having different duty ratio is generated; and the period of the control signal is changed by selecting a signal from the set of signals for each comparison section.

6. A method for controlling an analog/digital converter according to claim 1, wherein a set of signals having different duty ratio is generated; a software program sets a value in a register for each comparison section; and the period of the control signal is changed by selecting one of the signals for each comparison section, according to the set value in the register.

* * * * *